(12) United States Patent
Ishimura et al.

(10) Patent No.: US 6,849,952 B2
(45) Date of Patent: Feb. 1, 2005

(54) SEMICONDUCTOR DEVICE AND ITS MANUFACTURING METHOD

(75) Inventors: Hiroki Ishimura, Chino (JP);
Katsunori Takahashi, Hakodate (JP);
Mitsuru Sakamoto, Chitose (JP);
Naohito Asari, Chitose (JP)

(73) Assignees: Renesas Technology Corp., Tokyo (JP); Renesas Northern Japan Semiconductor, Inc., Hokkaido (JP)

( * ) Notice: Subject to any disclaimer, the term of this patent is extended or adjusted under 35 U.S.C. 154(b) by 0 days.

(21) Appl. No.: 10/417,092

(22) Filed: Apr. 17, 2003

(65) Prior Publication Data

US 2004/0021231 A1 Feb. 5, 2004

(30) Foreign Application Priority Data

Apr. 19, 2002 (JP) ..................................... P2002-116982

(51) Int. Cl.[7] .............................................. H01L 23/48
(52) U.S. Cl. ....................... 257/777; 257/257; 257/666; 257/723; 257/787
(58) Field of Search .............................. 257/777, 666, 257/787, 723

(56) References Cited

U.S. PATENT DOCUMENTS

| | | | | |
|---|---|---|---|---|
| 6,080,931 A | * | 6/2000 | Park et al. | 174/52.4 |
| 6,100,594 A | * | 8/2000 | Fukui et al. | 257/777 |
| 6,353,263 B1 | * | 3/2002 | Dotta et al. | 257/777 |
| 6,388,313 B1 | * | 5/2002 | Lee et al. | 257/686 |
| 6,472,736 B1 | * | 10/2002 | Yeh et al. | 257/686 |
| 6,583,512 B2 | * | 6/2003 | Nakaoka et al. | 257/777 |
| 6,590,281 B2 | * | 7/2003 | Wu et al. | 257/684 |
| 6,759,737 B2 | * | 7/2004 | Seo et al. | 257/686 |
| 2002/0027281 A1 | * | 3/2002 | Goto | 257/693 |

FOREIGN PATENT DOCUMENTS

| | | |
|---|---|---|
| JP | 11-204720 A | 7/1999 |
| JP | 2001-15644 A | 1/2001 |
| JP | 2001-127199 A | 5/2001 |
| JP | 2001-267488 A | 9/2001 |
| JP | 2001-284523 A | 10/2001 |

* cited by examiner

*Primary Examiner*—Jasmine Clark
(74) *Attorney, Agent, or Firm*—Antonelli, Terry, Stout & Kraus, LLP

(57) ABSTRACT

A non-lead type, stacked-type semiconductor device includes a sealing body of insulative resin, a tab, leads, each having one surface exposed on a mounting surface of the sealing body, a first semiconductor chip located in the sealing body having a first circuit-forming surface and a second surface supported on the tab through adhesive, electrode pads formed in the periphery of the first surface, conductive wires for electrically connecting the electrode pads and the leads, a second semiconductor chip having a first circuit-forming surface and a second surface opposite to the first surface, and stacked and mounted on the first surface of the first semiconductor chip toward the second surface thereof, electrode pads formed on the first surface of the second semiconductor chip, and conductive wires for electrically connecting the electrode pads of the second semiconductor chip and the leads.

14 Claims, 21 Drawing Sheets

SEMICONDUCTOR DEVICE AND ITS MANUFACTURING METHOD

BACKGROUND OF THE INVENTION

The present invention relates to a manufacturing technique of a resin-sealed semiconductor device and, particularly, to a technique effectively applied to a semiconductor device suitable for high-density mounting like a multi-chip package, in which a plurality of LSI chips are embedded in one package.

With demands for the reduction in size of a semiconductor package in recent years, there has been a demand for a semiconductor device of the type generally called a multi-chip package (hereinafter "MCP") or system-in package in which a plurality of LSI chips are embedded in one package. One example of such an MCP structure is a stacked structure in which two LSI chips are, for example, stacked and resin-molded to form a package. A concrete example of an MCP with the stacked structure is an MCP of a QFP (Quad Flat leaded Package) type in which LSI chips are stacked in the package, such as disclosed in the gazette of Japanese Patent Laid-Open No. 2001-267488, etc. The MCP of this type includes: a plurality of stacked LSI chips; a plurality of wires to electrically connect electrode pads of the LSI chips and external connection leads; a resin sealing body, formed by resin-mold, sealing a plurality of inner leads; and outer leads led out from the side surfaces of the resin sealing body. The resin sealing body is mounted to a mounting board by these outer leads. Also, another example of an MCP is of a so-called CSP (Chip Size Package) type, such as described in the gazette of Japanese Patent Laid-Open No. 11-204720, in which a plurality of LSI chips are stacked on a wiring board made of epoxy or polyimide and electrode pads of the respective LSI chips and electrodes on the wiring board are electrically connected by wire bonding or face-down bonding and the respective LSI chips on the wiring board and the electrically connected portions thereof are molded in resin (i.e., resin-sealed).

SUMMARY OF THE INVENTION

Since the outer leads are led out from the side surfaces of the resin sealing body and the resin sealing bodies are structurally located on and below a tab, the MCP of the above-mentioned QFP type requires both a large mounting area and a large mounting height, which is unsuitable for mounting a the mounting board built-in a current mobile device such as a cellular phone or a mobile computer. Also, with respect to the MCP of the CSP type, since the mounting area thereof is small, it is suitable for mounting onto the mounting board of a current mobile device. Thus, the CSP type is advantageous when the package is rather multifunctional and the number of external connection pins are large. However, since an insulative board (resin board or film made of epoxy, polyimide, etc.), and ball-shaped mounting external terminals made of solder and the like are used as components, the material cost is high, a special manufacturing machine is required and the number of production steps is increased. Consequently, when the number of external connection pins is small, there arises a problem such that the CSP type MCP becomes relatively expensive. Additionally, since the ball-shaped mounting external terminals are used, its height inevitably becomes increased thereby limiting the reduction in the mounting height. Furthermore, since there are restrictions in the chip size and in the arrangement of the electrode pads in stacking the LSI chips, it is difficult to use the existing LSI chips and connect respective electrode pads between the two stacked LSI chips. Therefore, a problem occurs in that the extension of leads are restricted.

The inventors of the present invention have conducted an extensive examination to effectively solve the above-mentioned problems. Thus, an object of the present invention is to provide a multi-chip type semiconductor device, which has both a very small mounting area and mounting height and can be manufactured at low cost through using the existing production line, and to provide a manufacturing method to achieve the same.

The above and other problems, objects and novel characteristics of the present invention will be apparent from the description of this specification and the accompanying drawings.

Representative inventive aspects disclosed in this application are briefly described below.

1. One representative aspect of the present invention is directed to a semiconductor device, including: a sealing body made of an insulative resin; a tab on which a semiconductor chip is mounted; a plurality of leads each having one surface exposed on a mounting surface of the sealing body; a first semiconductor chip located in the sealing body and having a first surface to be a circuit forming surface (i.e., a first circuit forming surface) and a second surface opposite to the first surface, the second surface being supported on one surface of the tab through adhesive; a plurality of electrode pads formed in the periphery of the first surface of the first semiconductor chip; conductive wires for electrically connecting the electrode pads and the leads; a second semiconductor chip having a first surface to be a circuit forming surface and a second surface opposite to the first surface, and stacked and mounted on the first surface of the first semiconductor chip toward the second surface thereof; a plurality of electrode pads formed on the first surface of the second semiconductor chip; and conductive wires for electrically connecting the electrode pads of said second semiconductor chip and the leads.

The second semiconductor chip is arranged at a position inside the electrode pads of the first semiconductor chip. Bumps are formed on the electrode pads of the second semiconductor chip, one end of each of the wires thereof is connected to each of the leads or the electrode pads of the first semiconductor chip, and the other end thereof is connected through each of the bumps. At least one of the plurality of electrode pads of the first semiconductor chip are electrically connected to the tab by the wires.

2. Another aspect of the present invention is directed to a semiconductor device, including: a sealing body made of an insulative resin; a tab for supporting a semiconductor chip; a plurality of leads each having one surface exposed on a mounting surface of the sealing body; a first semiconductor chip located in the sealing body, having a first surface to be a circuit forming surface and a second surface opposite to the first surface, and supported on one surface of the tab through adhesive; a plurality of electrode pads formed in the periphery of the first surface of the first semiconductor chip; conductive wires for electrically connecting the electrode pads and the leads; a second semiconductor chip having a first surface to be a circuit forming surface and a second surface opposite to the first surface, and stacked and mounted on the first surface of the first semiconductor chip; and conductive wires for electrically connecting a plurality of electrode pads formed on the first surface of the second semiconductor chip and the leads.

The tab is formed into a frame shape; the first semiconductor chip is adhered to one surface of the frame-shaped tab at a position inside the electrode pads on the first surface thereof; the second semiconductor chip is located on the first surface of the first semiconductor chip and at a position inside an opening of the frame-shaped tab; and the frame-shaped tab and the second semiconductor chip are adhered on the same surface. The first semiconductor chip and the second semiconductor chip are connected to each other by connecting at least two of the electrode pads formed on each first surface through the conductive wires, or are connected to the frame-shaped tab through the conductive wires.

3. Another aspect of the present invention is directed to a semiconductor device, including: a sealing body made of an insulative resin; a tab for supporting a semiconductor chip; a plurality of leads each having one surface exposed on a mounting surface of the sealing body; a first semiconductor chip located in the sealing body, having a first surface to be a circuit forming surface and a second surface opposite to the first surface, and supported on one surface of the tab through adhesive; a plurality of electrode pads formed in the periphery of the first surface of the first semiconductor chip; and conductive wires to electrically connect the electrode pads and the leads, wherein the device further includes a second semiconductor chip having a first surface to be a circuit forming surface and a second surface opposite to the first surface; the second surface of the second semiconductor chip is adhered to one surface of the tab; the electrode pads and the leads and a plurality of electrode pads formed on the first surface of the second semiconductor chip are electrically connected through the conductive wires; the first surface of the first semiconductor chip is adhered to the other surface of the tab; and the tab and the second semiconductor chip are each located at a position inside the electrode pads on the first surface of the first semiconductor chip.

The first semiconductor chip and the second semiconductor chip are connected to each other by connecting at least two of the electrode pads formed on each first surface through the conductive wires, or are connected to the tab through the conductive wires.

4. Still another aspect of the present invention is directed to a manufacturing method for a semiconductor device, the method including:

(a) preparing a lead frame having a first frame portion, a second frame portion formed inside the first frame portion, a plurality of device regions formed inside the second frame portion, and tabs and a plurality of lead portions, which are formed in each of the plurality of device regions;

(b) supporting a plurality of first semiconductor chips, each of which has a plurality of electrode pads, on the respective tabs on the plurality of device regions of the lead frame;

(c) supporting a plurality of second semiconductor chips, each of which has a plurality of electrode pads, on a first surface to be a circuit forming surface of each of the plurality of first semiconductor chips;

(d) electrically connecting each plurality of electrode pads of the first semiconductor chips and of the second semiconductor chips to a plurality of lead portions of the lead frame through a plurality of wires, respectively;

(e) forming a resin sealing body such that the first and second semiconductor chips, the wires, and portions of the leads are sealed and the portions of the leads are exposed from the mounting surface; and (f) after the forming of the resin sealing body, separating the lead frame and the resin sealing body per each of the device regions.

5. Still another aspect of the present invention is directed to a manufacturing method for a semiconductor device, in which a plurality of tabs each formed into a flat shape are used and a plurality of first and second semiconductor chips are supported on and below each of them, the method including:

(a) preparing a lead frame having a first frame portion, a second frame portion formed inside the first frame portion, a plurality of device regions formed inside the second frame portion, and tabs and a plurality of lead portions, which are formed in each of the device regions;

(b) adhering a first surface, corresponding to a circuit forming surface, of each of a plurality of first semiconductor chips, each having a plurality of electrode pads, and one surface of each of said tabs, to the plurality of device regions of the lead frame, through an insulative adhesive;

(c) supporting a plurality of second semiconductor chips, each having a plurality of electrode pads, onto the said one surfaces of the plurality of tabs, through conductive adhesive;

(d) electrically connecting the plurality of electrode pads of each of the plurality of first semiconductor chips and of the second semiconductor chips to the plurality of lead portions of the lead frame through a plurality of wires, respectively;

(e) forming a resin sealing body such that the plurality of first and second semiconductor chips, the plurality of wires, and portions of the plurality of leads are sealed and the portions of the plurality of leads are exposed from the mounting surface; and (f) after the step of forming the resin sealing body, separating the lead frame and resin sealing body per each of the device regions.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted.

(First Embodiment)

Description of the first embodiment will be given in conjunction with FIGS. 1 to 13.

Figure 1:
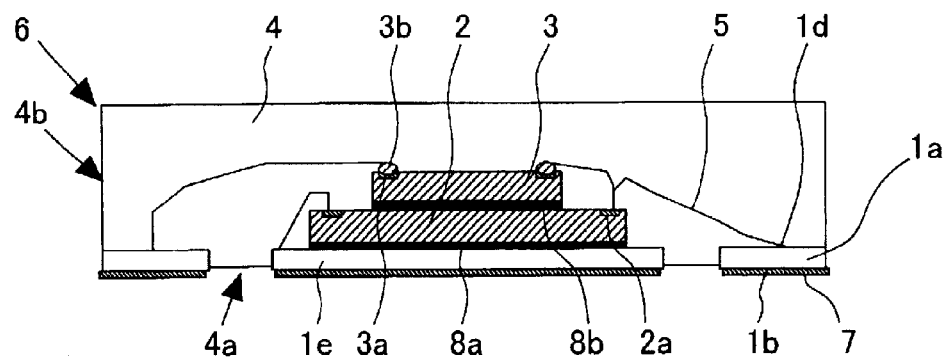
FIG. 1 is a cross-sectional view showing an example of a structure of a semiconductor device according to a first embodiment of the present invention.
Figure 2:
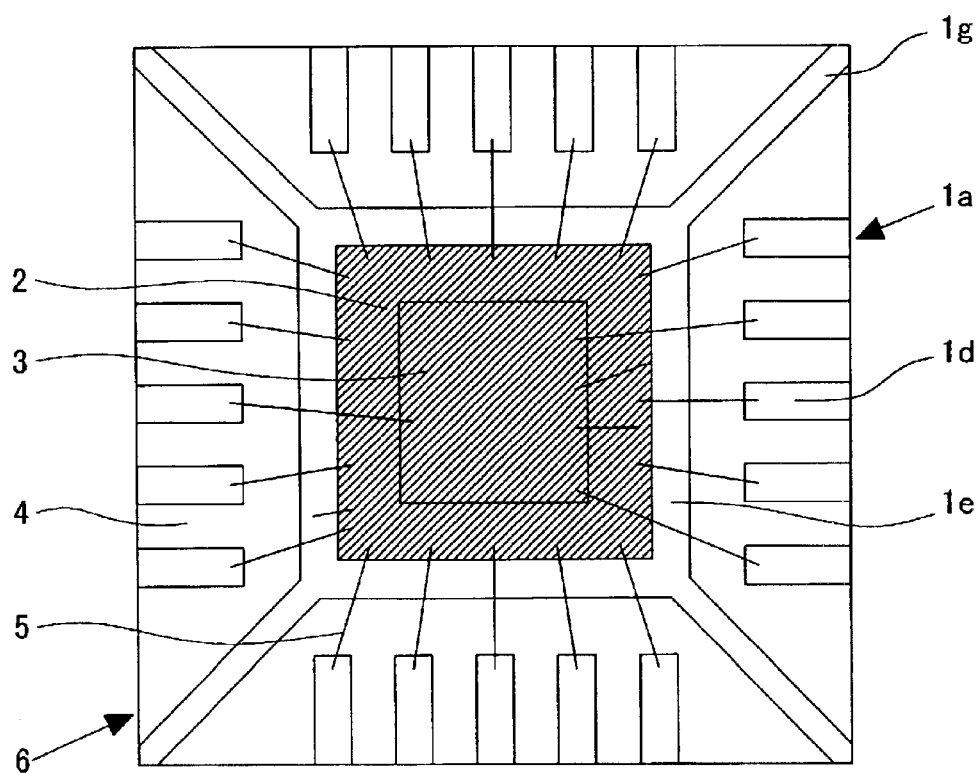
FIG. 2 is a plan view showing the structure of the semiconductor device shown in FIG. 1.
Figure 3:
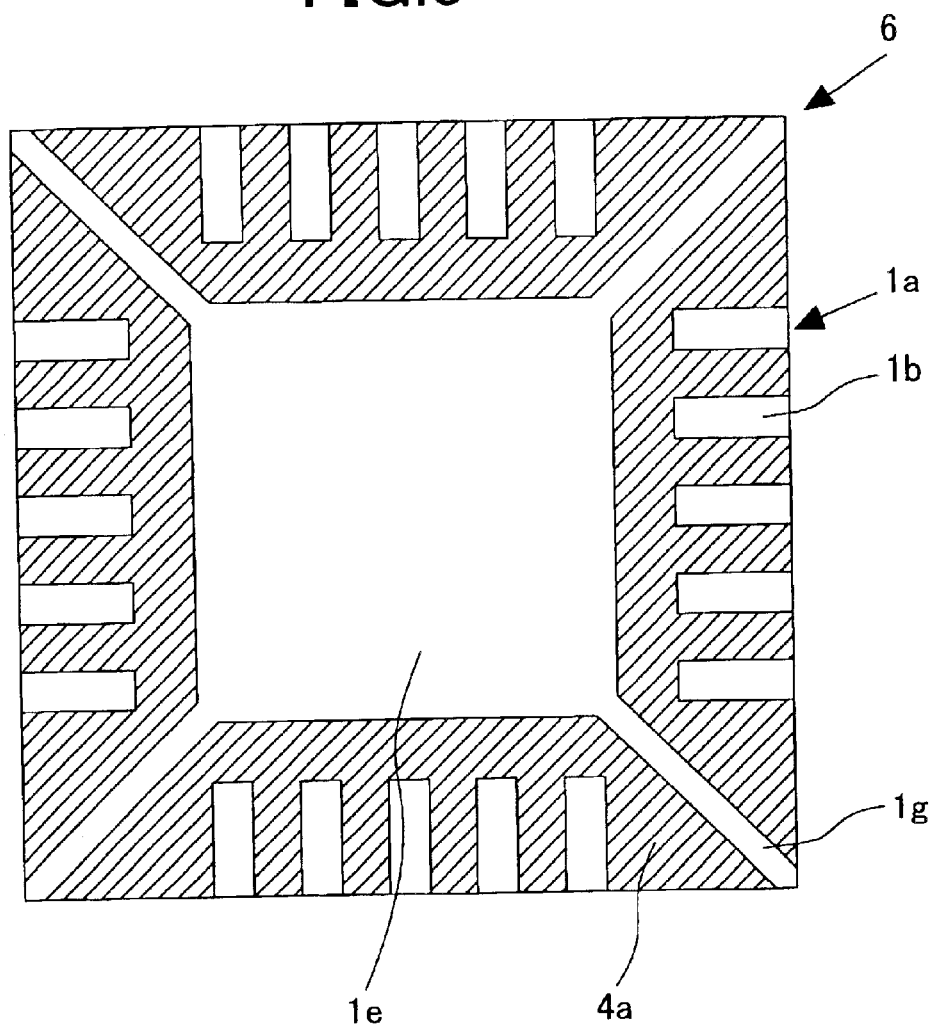
FIG. 3 is a bottom plan view (mounting surface) showing the structure of the semiconductor device shown in FIG. 1.

A semiconductor device shown in FIGS. 1 to 3 is a semiconductor package of a resin-sealed type and a surface-mounting type employing a lead frame. In the description of the first embodiment, the tab-exposed type semiconductor device 6 is taken as an example of this semiconductor device.

As shown in FIG. 1, in the semiconductor device 6, a first semiconductor chip 2 is adhered and supported on a second surface opposite to a first surface to be a circuit forming surface, via a conductive die bond material 8a such as silver paste or adhering film on a tab 1e (chip mounting portion). A second surface of a second semiconductor chip 3 is stacked and mounted on the first surface of the first semiconductor chip via an insulative die bond material 8b such as silicone rubber and insulative sheet, etc. Also, a plurality of electrode pads 2a and 3a of the respective semiconductor chips and a plurality of leads 1a are connected by conductive wires 5 such as gold wires.

Since the electrode pads in the periphery of the second semiconductor chip 3 are located inside the electrode pads in the periphery of the first semiconductor chip 2, it is easily possible to connect the plurality of electrode pads 2a and 3a of the respective semiconductor chips and the plurality of leads 1a through the conductive wires 5.

Bumps 3b made of gold or the like are formed on the plurality of electrode pads 3a of the second semiconductor chip 3 in advance in the same manner as that used to form wire bumps. In performing the wire bonding, the side of each lead 1a or the first semiconductor chip 2 is first bonded by using gold balls (tips) formed on the wires 5 (hereinafter "first bonding"). Thereafter, the tails (end) of the wires 5 are bonded to the bumps 3b (hereinafter "second bonding"), whereby each angle of the wires 5 on the bumps 3b becomes almost horizontal. Therefore, it is possible to keep lower the height of the wires and achieve the reduction of thickness of the semiconductor device 6 even when the semiconductor chips are stacked.

The side of the electrode pad 2a on the first semiconductor chip 2 is connected by the first bonding and the side of each lead 1a (including lead 1d) is connected by the second bonding. Further, the first semiconductor chip 2 and the tab 1e are also wire-bonded. Accordingly, this device is one with a tab-exposed structure in which the tab 1e and tab suspension leads 1g are exposed from the mounting surface 4a.

The resin used to form a sealing resin portion 4 is, for example, thermosetting epoxy resin, etc.

Note that the semiconductor device 6 is assembled through a method (package molding) such that a plurality of device regions are sealed in one sealing resin body and the semiconductor-sealing resin portion is cut and divided into each of the device regions by the dicing.

Next, the manufacturing method for the semiconductor device 6 according to the first embodiment will be described.

Figure 4:
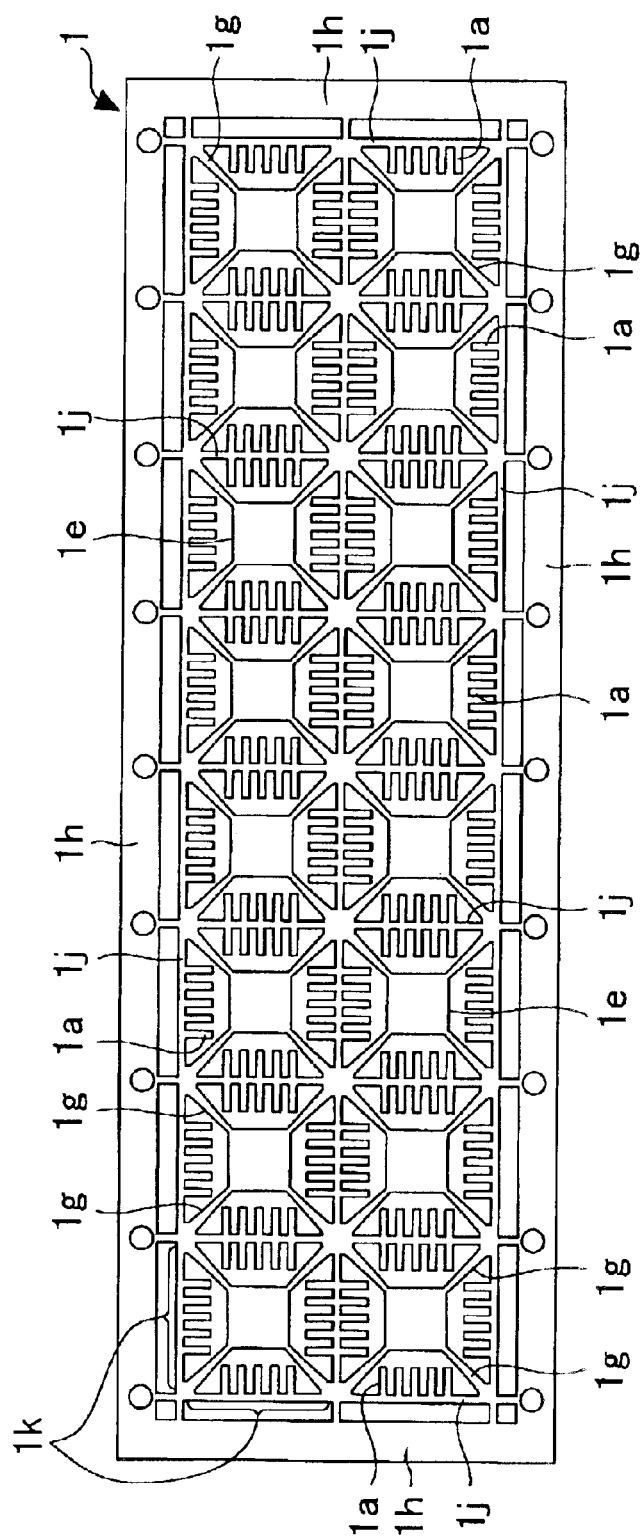
FIG. 4 is a plan view showing an example of a structure of a lead frame used in assembling the semiconductor device shown in FIG. 1.
Figure 5:
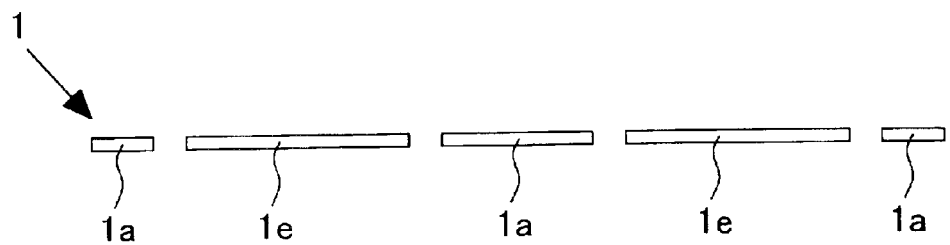
FIG. 5 is a cross-sectional view showing an example of the structure of the lead frame shown in FIG. 4.

First, a lead frame 1 as shown in FIG. 4 is prepared, which includes: an outer frame portion 1h to be a first frame portion; an inner frame portion 1j to be a second frame portion formed inside the outer frame 1h; a plurality of device regions 1k to be device regions formed inside the inner frame portion 1j; a plurality of leads 1a to be electrode portions formed in each of the plurality of device regions 1k; and a plurality of tabs 1e to be chip mounting portions formed in each of the plurality of device regions 1k.

Figure 6:
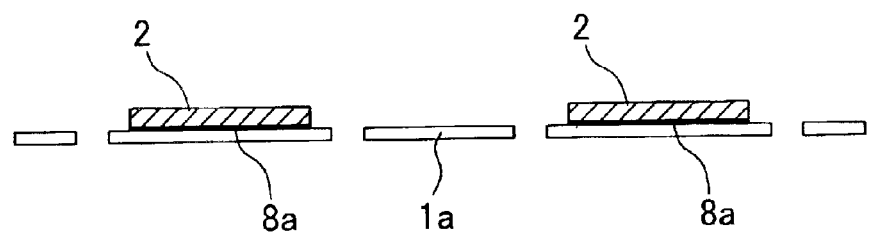
FIG. 6 is a cross-sectional view showing an example of the structure obtained after the die bonding of a first semiconductor chip in assembling the semiconductor device shown in FIG. 1.

Next, as shown in FIG. 6, a plurality of first semiconductor chips 2, each having a plurality of electrode pads 2a, are adhered and supported, on the second surface opposite to the first surface to be a circuit forming surface, via a conductive die bond material 8a such as silver paste or adhering film, the second surface being over the respective tabs 1e of the plurality of device regions 1k of the lead frame 1 (die bonding).

Figure 7:
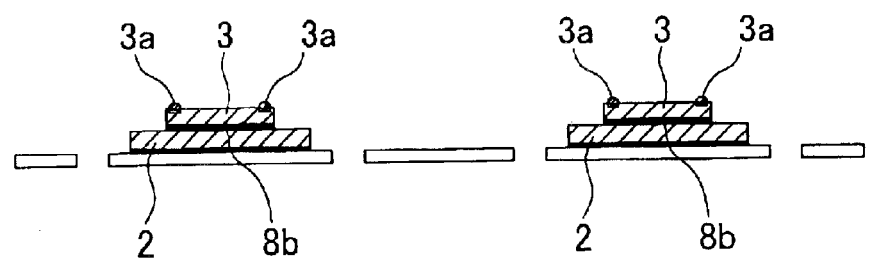
FIG. 7 is a cross-sectional view showing an example of the structure obtained after the die bonding of a second semiconductor chip in assembling the semiconductor device shown in FIG. 1.

Subsequently, as shown in FIG. 7, the second surface of the second semiconductor chip 3, which is opposite to the first surface to be a circuit forming surface, is adhered and supported on the first surface of the first semiconductor chip 2 via the insulative die bond material 8b such as silicone rubber or insulative sheet, etc.

Figure 8:
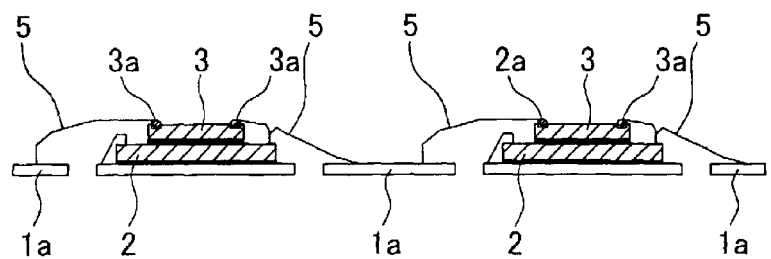
FIG. 8 is a cross-sectional view showing an example of the structure obtained after the wire bonding in assembling the semiconductor device shown in FIG. 1.

Next, as shown in FIG. 8, through conductive wires 5 such as gold wires etc., the plurality of electrode pads 2a of the first semiconductor chip 2 are connected to the plurality of leads 1a, the tab 1e, or some of the electrode pads 3a of the second semiconductor chip 3. Furthermore, the plurality of electrode pads 3a of the second semiconductor chip 3 are connected to the plurality of leads 1a or the tab 1e (wire bonding). In this case, bumps made of gold etc. are formed on the electrode pads 3a of the second semiconductor chip 3 in advance, for example, in the same manner as that used to form wire bumps. The wire bonding is used as the first bonding on the side of each lead 1a or the first semiconductor chip 2, and as the second bonding on the side of each bump. The second bonding is performed to the bumps.

Figure 9:
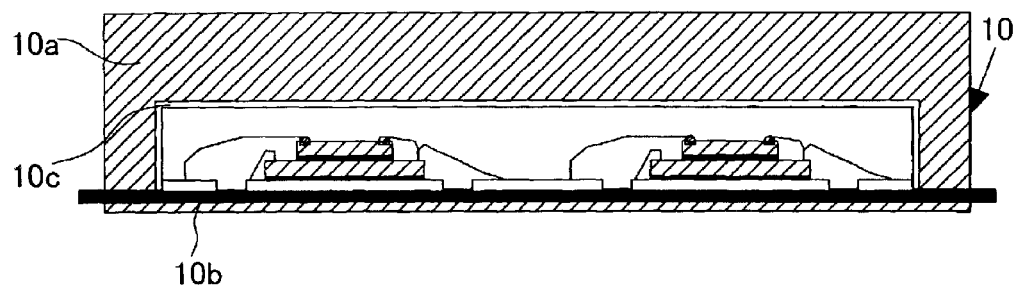
FIG. 9 is a cross-sectional view showing an example of the structure of a molding state obtained in assembling the semiconductor device shown in FIG. 1.

Subsequently, as shown in FIG. 9, the plurality of first semiconductor chips 2, the plurality of second semiconductor chips 3, the plurality of wires 5, and the parts of the leads 1a and the tabs 1e of the lead frame 1 are covered with a molding die 10, and the package molding is performed for filling a sealing resin into a cavity 10c. By so doing, the sealing resin portion 4 is formed as shown in FIG. 10.

Note that, instead of the package molding in this case, a method of individually sealing the device regions by each cavity separated is of course available.

Figure 10:
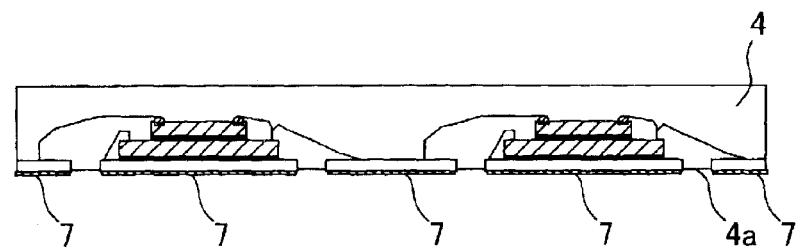
FIG. 10 is a cross-sectional view showing an example of the structure of an outer-packaging plated state obtained in assembling the semiconductor device shown in FIG. 1.

Thereafter, as shown in FIG. 10, a plating film 7 made of solder is formed by, for example, an electroplating method on the surface of the external connection terminal 1b of each lead 1a and the surface of the tab 1e, which are exposed on the mounting surface 4a of the sealing resin portion 4.

Figure 11:
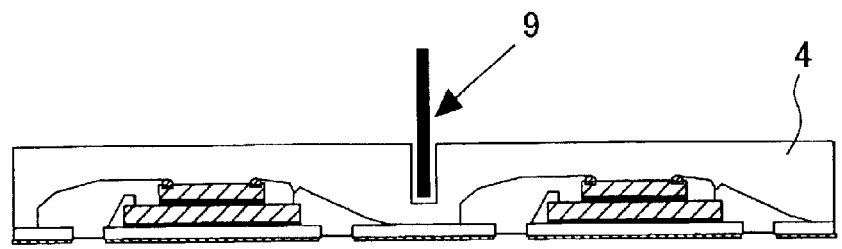
FIG. 11 is a cross-sectional view showing an example of the structure of a dicing state obtained in assembling the semiconductor device shown in FIG. 1.
Figure 12:
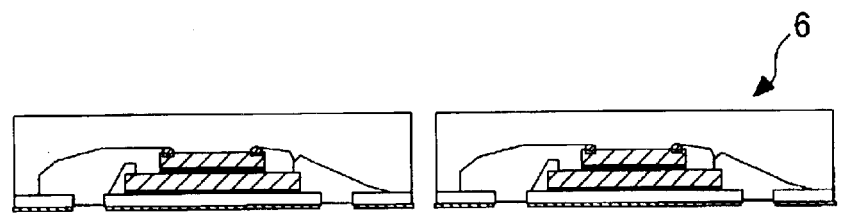
FIG. 12 is a cross-sectional view showing an example of the structure obtained after the dicing in assembling the semiconductor device shown in FIG. 1.

Then, by the dicing employing a dicing blade 9 shown in FIG. 11, the lead frame 1 and the sealing resin portion 4 are cut together per each of the device regions, thereby being individualized as shown in FIG. 12. Each sealing resin portion, which is formed per each of the device regions by the individual cavity, is individualized with a cutting blade.

Figure 13:
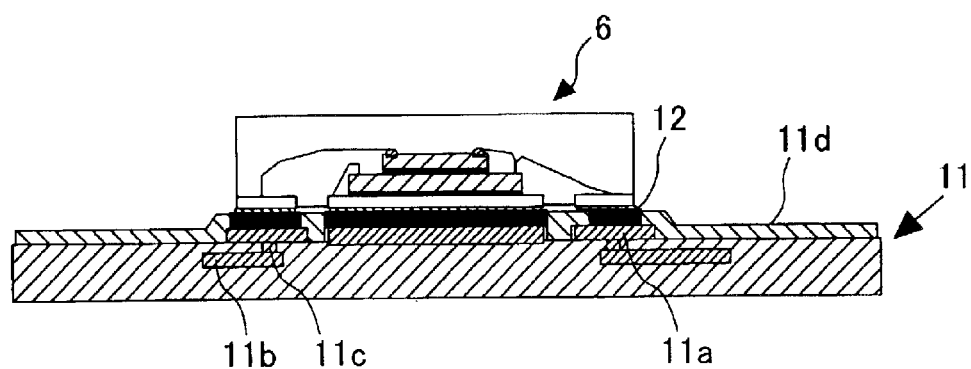
FIG. 13 is a cross-sectional view showing an example of the structure obtained after the mounting onto a board in mounting the semiconductor device shown in FIG. 1.

FIG. 13 is an example showing a structure of the state where the semiconductor device 6 completed by individualization is mounted on the mounting board 11. Electrodes (lands) 11a are provided on one surface of the mounting board 11 so as to correspond to the leads 1b, the tab 1e, and the tab suspension leads 1g to be the external connection terminals of the above-mentioned semiconductor device 6. Thus, the leads 1b, the tab 1e, and the tab suspension leads 1g to be the external connection terminals of the semiconductor device 6 are overlapped on these lands 11a, and are electrically connected via a connection material 12 such as solder, etc.

The first embodiment has, in view of the reliability, a structure in which the tab surface exists inside the package in order to enlarge the contact area between the tab surface and the resin for forming the package. Also, it has, in view of the heat radiation, a structure in which the tab is made larger than the chip and is exposed to the mounting surface side in order to transmit, to the wide area, heat generated in the semiconductor chip.

(Second Embodiment)

Description of the second embodiment will be given in conjunction with FIGS. 14 to 26.

Figure 14:
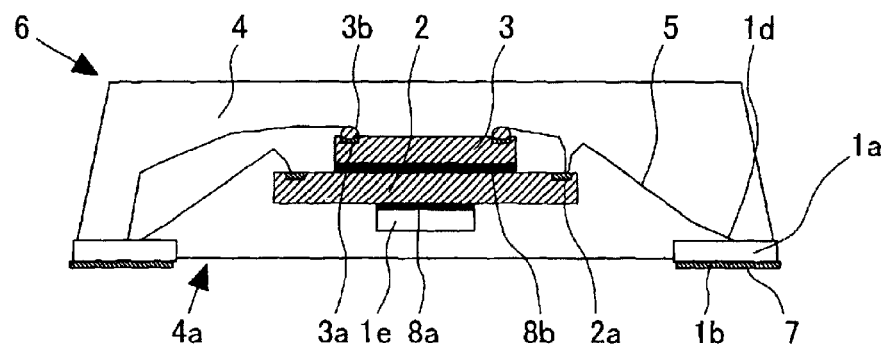
FIG. 14 is a cross-sectional view showing an example of a structure of a semiconductor device according to a second embodiment of the present invention.
Figure 15:
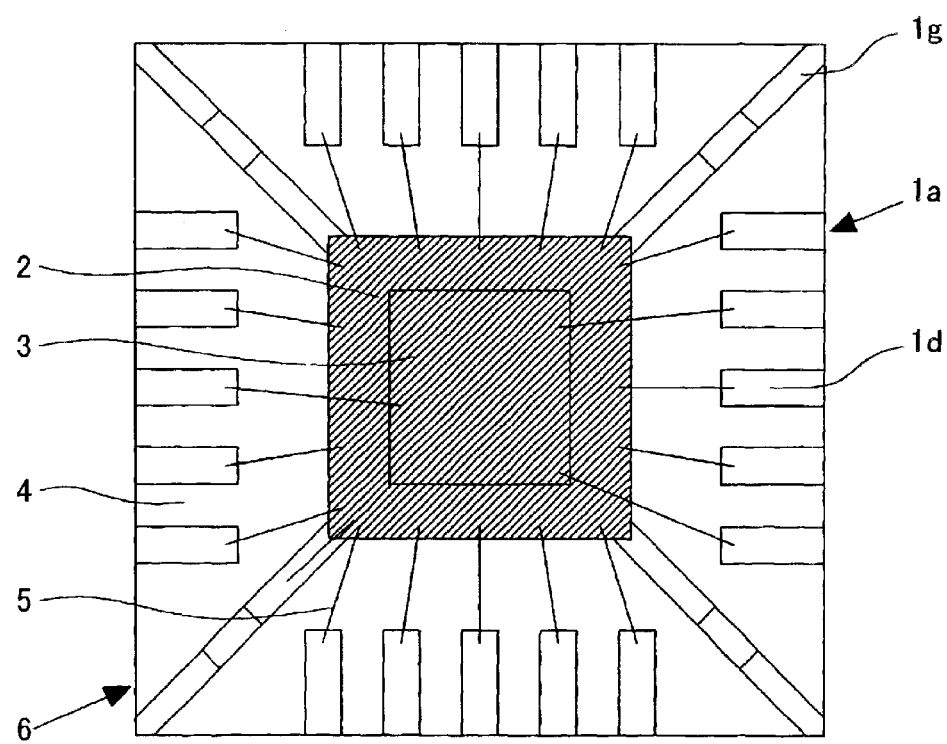
FIG. 15 is a plan view showing the structure of the semiconductor device shown in FIG. 14.
Figure 16:
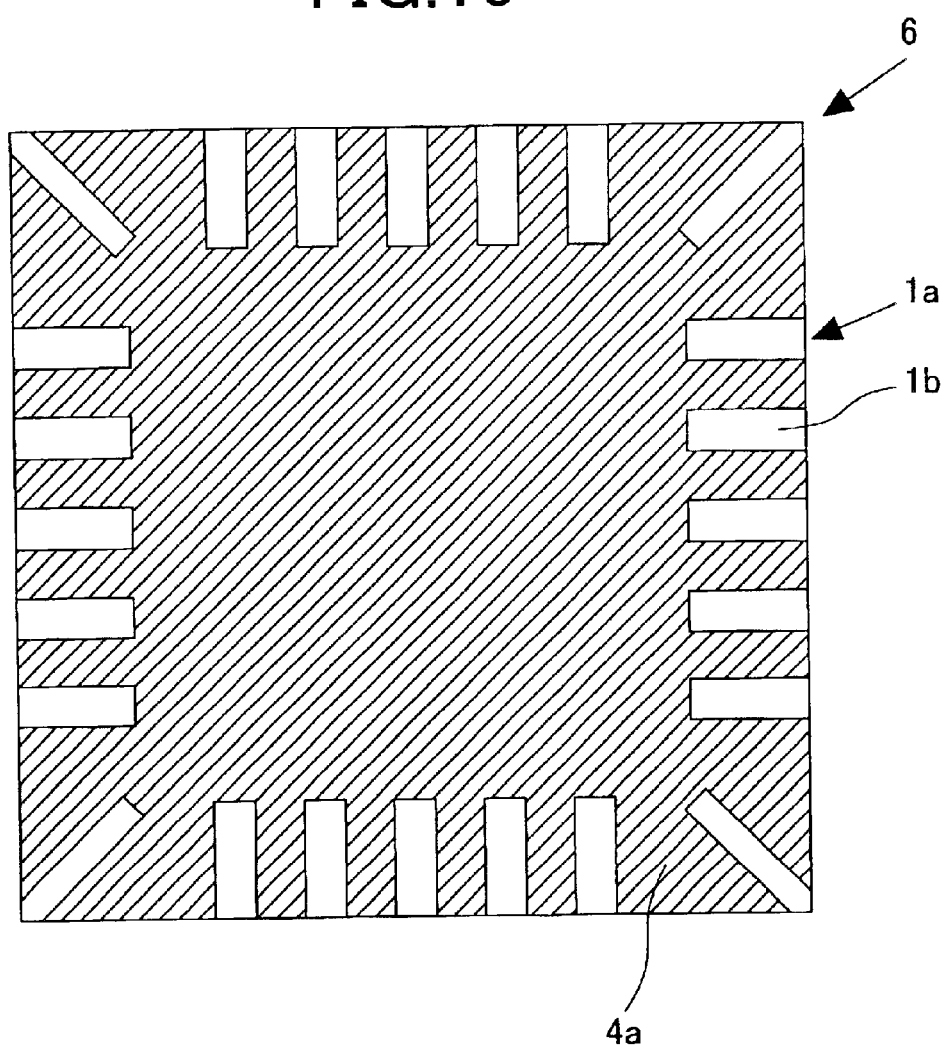
FIG. 16 is a bottom plan view (mounting surface) showing the structure of the semiconductor device shown in FIG. 14.

The semiconductor device shown in FIGS. 14 to 16 is a semiconductor package of a resin-sealed type and a surface-mounting type employing a lead frame. In the description of a second embodiment, the semiconductor device 6 of a tab-embedded type is taken as an example of this semiconductor device.

As shown in FIG. 14, in the semiconductor device 6, a second surface of a first semiconductor chip 2, which is opposite to a first surface to be its circuit forming surface, is adhered and supported on a tab 1e (chip mounting portion) via a conductive die bond material 8a such as silver paste or adhering film. A second semiconductor chip 3 is stacked and mounted on the first surface via an insulative die bond material 8b such as silicone rubber or insulative sheet, etc. Also, a plurality of electrode pads 2a and 3a of each semiconductor chip and a plurality of leads 1a are connected by conductive wires 5 such as gold wires, etc., respectively.

At this time, since the electrode pads in the periphery of the second semiconductor chip 3 are located inside those in the periphery of the first semiconductor chip 2, the plurality of electrode pads 2a and 3a of each semiconductor chip and a plurality of leads 1a can be easily connected through the conductive wires 5.

Bumps made of gold, etc. are formed on the electrode pads 3a of the second semiconductor chip 3 in advance, for example, in the same manner as that used to form wire bumps. In the wire bonding, the side of each lead 1a or the first semiconductor chip 2 is first bonded by using gold balls (tips) formed on the wires 5 (hereinafter "first bonding"). Thereafter, the tails (end) of the wires 5 are bonded to the bumps 3b (hereinafter "second bonding"), whereby each angle of the wires 5 on the bumps 3b becomes almost horizontal. Therefore, it is possible to keep lower the height of the wires and to achieve the reduction of thickness of the semiconductor device 6 even if the semiconductor chips are stacked.

The side of the first semiconductor chip 2 is connected by the first bonding, and the side of each lead 1d is connected by the second bonding, and further the first semiconductor chip 2 and the tab suspension leads 1g are also wire-bonded. Therefore, portions of the tab suspension leads 1g are exposed from the bottom surface, and the tab 1e is embedded in the sealing resin portion 4.

The resin used to form the sealing resin portion 4 is, for example, thermosetting epoxy resin, etc.

Next, the manufacturing method for the semiconductor device 6 according to the second embodiment will be described.

Figure 17:
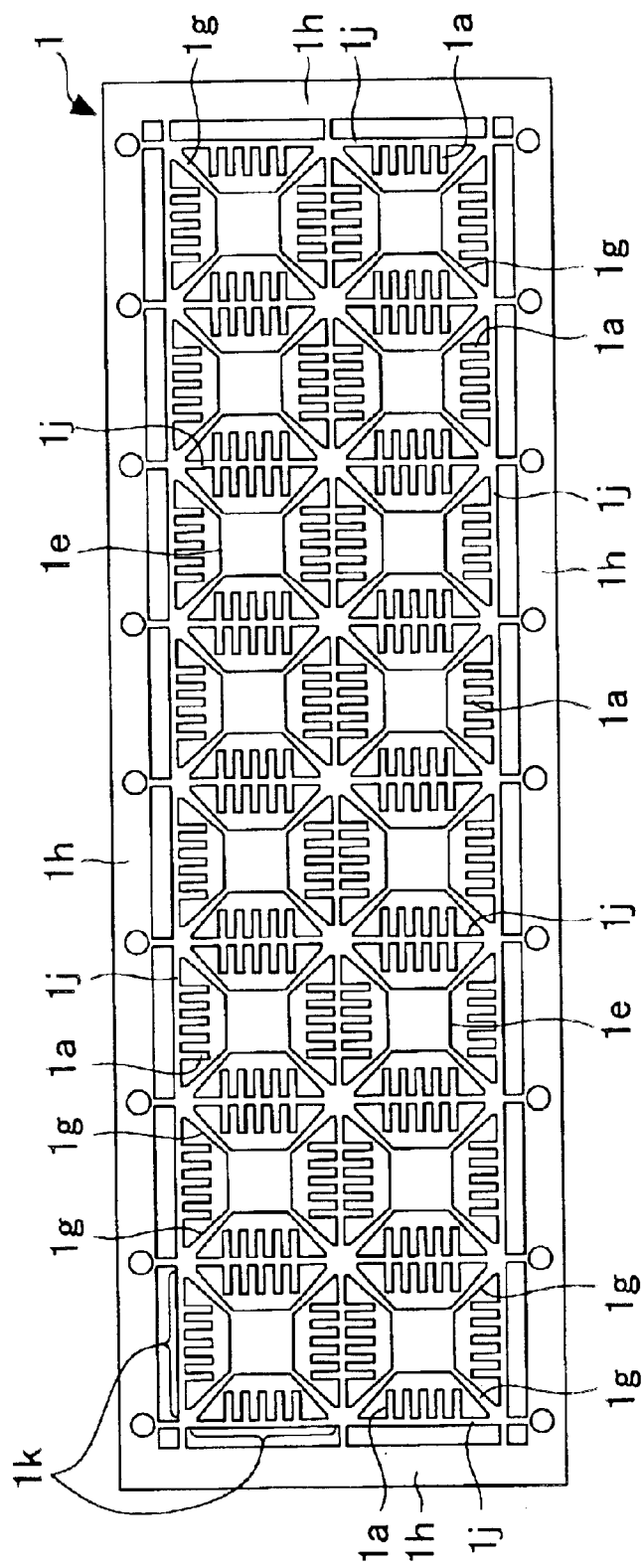
FIG. 17 is a plan view showing an example of a structure of a lead frame used in assembling the semiconductor device shown in FIG. 14.
Figure 20:
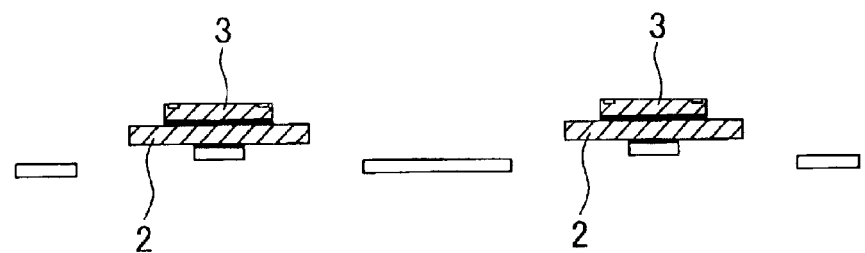
FIG. 20 is a cross-sectional view showing an example of the structure obtained after the die bonding of a second semiconductor chip in assembling the semiconductor device shown in FIG. 14.

Since the manufacturing method from the preparation of the lead frame 1 shown in FIG. 17 to the die bonding step shown in FIG. 20 is the same as that in the first embodiment, the description thereof will be omitted.

Figure 18:
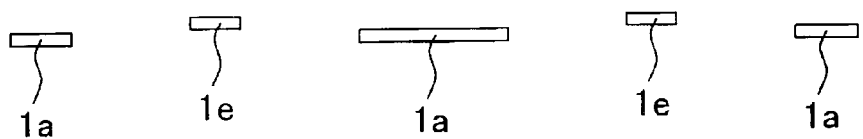
FIG. 18 is a cross-sectional view showing an example of the structure of the lead frame shown in FIG. 17.
Figure 19:
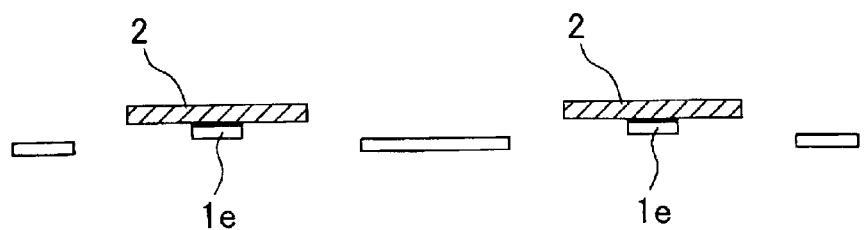
FIG. 19 is a cross-sectional view showing an example of the structure obtained after the die bonding of a first semiconductor chip in assembling the semiconductor device shown in FIG. 14.

However, in the lead frame 1 mentioned here, the surfaces of the tabs 1e are, as shown in FIG. 18, located about 0.1 to 0.3 mm higher than those of other lead frame surfaces.

Figure 21:
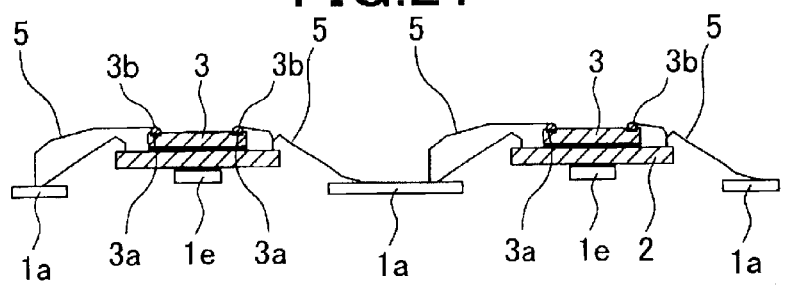
FIG. 21 is a cross-sectional view showing an example of the structure obtained after the wire bonding in assembling the semiconductor device shown in FIG. 14.

Next, as shown in FIG. 21, through the conductive wires 5 such as gold wires, etc., the plurality of electrode pads 2a of the first semiconductor chip 2 are connected to the plurality of leads 1a, the tab suspension leads 1g shown in FIG. 15, or some of the electrode pads 3a of the second semiconductor chip 3. Furthermore, the plurality of electrode pads 3a of the second semiconductor chip 3 are connected to the plurality of lead frames 1d. In this case, bumps made of gold, etc. are formed on the electrode pads 3a of the second semiconductor chip 3 in advance, for example, in the same manner as that used to form wire bumps. The wire bonding is used as the first bonding on the side of each lead 1a or the first semiconductor chip 2 and as the second bonding on the side of each bump 3b. The second bonding is performed to the bumps 3b.

Figure 22:
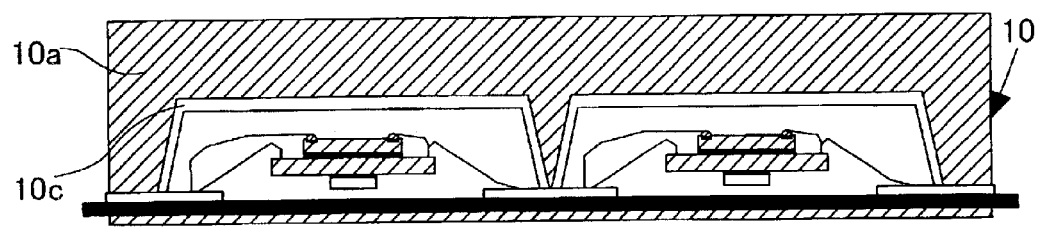
FIG. 22 is a cross-sectional view showing an example of the structure of a molding state obtained in assembling the semiconductor device shown in FIG. 14.

Subsequently, as shown in FIG. 22, the plurality of first semiconductor chips 2, the plurality of second semiconductor chips 3, the plurality of wires 5, and the leads 1a and the tabs 1e of the lead frame 1 are covered with a molding die 10, and the molding is performed by filling a sealing resin into a cavity 10c of the molding die 10. In this manner, the resin sealing body 4 is formed as shown in FIG. 23.

The molding die 10 mentioned here has, as shown in FIG. 22, a shape such that a cavity is partitioned per each of the plurality of device regions 1k. This is different from that used in the package molding in the first embodiment.

Figure 23:
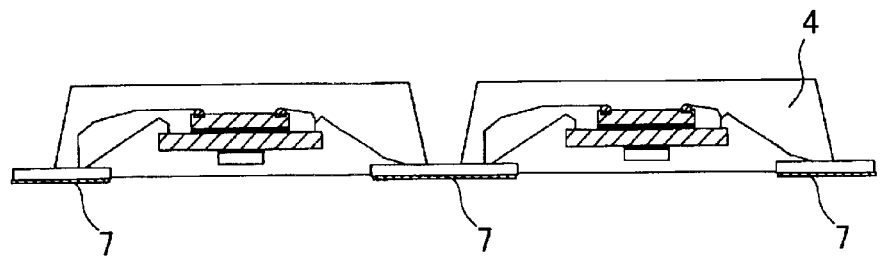
FIG. 23 is a cross-sectional view showing an example of the structure of a outer-packaging plated state obtained in assembling the semiconductor device shown in FIG. 14.

Next, as shown in FIG. 23, a plating film 7 of solder is formed by, for example, an electroplating method on the surface of the external connection terminal 1b of each lead 1a exposed to the rear surface 4a of the resin sealing body 4.

Figure 24:
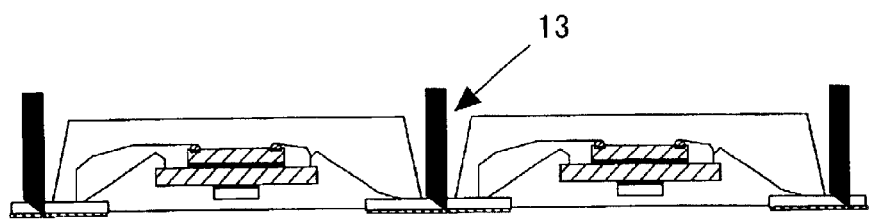
FIG. 24 is a cross-sectional view showing an example of the structure of a lead-cut state obtained in assembling the semiconductor device shown in FIG. 14.
Figure 25:
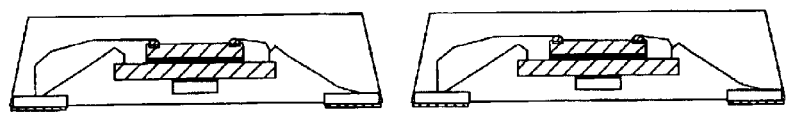
FIG. 25 is a cross-sectional view showing an example of the structure obtained after cutting the leads in assembling the semiconductor device shown in FIG. 14.

Subsequently, as shown in FIG. 24, the lead frame 1 is cut at regions other than the plurality of device regions 1k by a cutting blade 13, thereby being divided into pieces as shown in FIG. 25.

Figure 26:
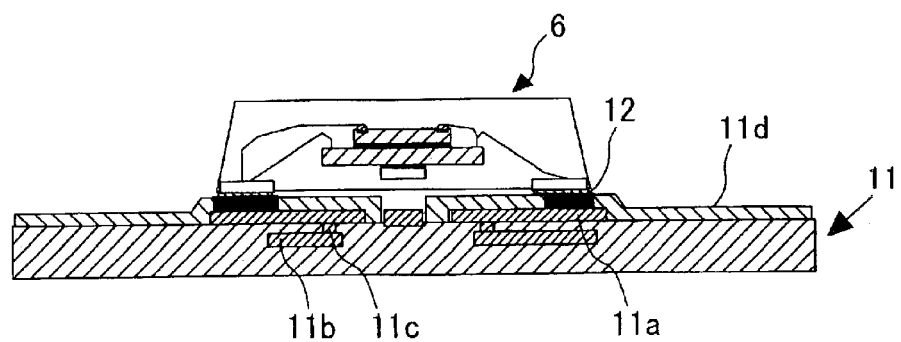
FIG. 26 is a cross-sectional view showing an example of the structure obtained after the mounting onto a board in mounting the semiconductor device shown in FIG. 14.

FIG. 26 is an example showing a structure of a state where the semiconductor device 6 completed by the individualization is mounted onto the mounting board 11. Lands (uppermost layer wirings) 11a are provided on one surface of the mounting board 11 so as to correspond to the leads 1b and the tab suspension leads 1g to be the external connection terminals of the semiconductor device 6. Thus, the leads 1b and the tab suspension leads 1g to be the external connection terminals of the semiconductor device 6 are overlapped on these lands 11a, and are electrically connected via a connection material 12 such as solder, etc.

The second embodiment has, in view of the reliability, a structure in which the tab rear surface exists inside the package. Also, in view of the heat radiation and the versatility for the size of the mounted chip, the tab is made smaller in size than the chip. Therefore, the region other than some portions of the leads 1b and the tab suspension leads 1g to be the external connection terminals of the semiconductor device 6 is covered with the sealing resin.

Consequently, as shown in FIG. 26, in the mounting board 11 on which the semiconductor device 6 is mounted, the uppermost layer wirings 11a (wirings in the same layer as the mounting lands) can be formed also in the region below the region other than some of the leads 1b and the tab suspension leads 1g to be the external connection terminals, thereby facilitating the improvement in a mounting capability.

Namely, in the case of the semiconductor device 6 described in the first embodiment, when the uppermost layer wiring 11a (particularly, signal wiring) is arranged below the tab 1e in the mounting board 11, the first semiconductor chip 2 is influenced by the noise from the wiring through the tab 1e. Therefore, it is difficult to arrange the uppermost layer wiring 11a of the mounting board 11 below the tab 1e.

Thus, according to the semiconductor device 6 in the second embodiment, since the insulative sealing resin exists on the rear surface (mounting surface side) of the tab 1e, it is possible to ensure the insulation on the rear surface of the tab 1e and to reduce the influence due to the noise from the uppermost layer wiring 11a of the mounting board 11. Therefore, as shown in FIG. 26, it is possible to arrange the uppermost layer wiring 11a such as a signal wiring etc. on the mounting board 11 even just below the first semiconductor chip 2 and the tab 1e.

As a result, it is possible to increase a wiring density in the wiring board 11 and to achieve the downsizing of the mounting board 11. In the mounting board 11 mentioned here, an inner wiring 11b is formed and the inner wiring 11b is connected to the uppermost layer wiring 11a through the via hole wiring 11c. Furthermore, the lead 1a of the semiconductor device 6 is connected to the uppermost layer wiring 11a through the solder 12. Additionally, the uppermost layer wiring 11a is partially covered with a solder resist film 11d.

(Third Embodiment)

Figure 27:
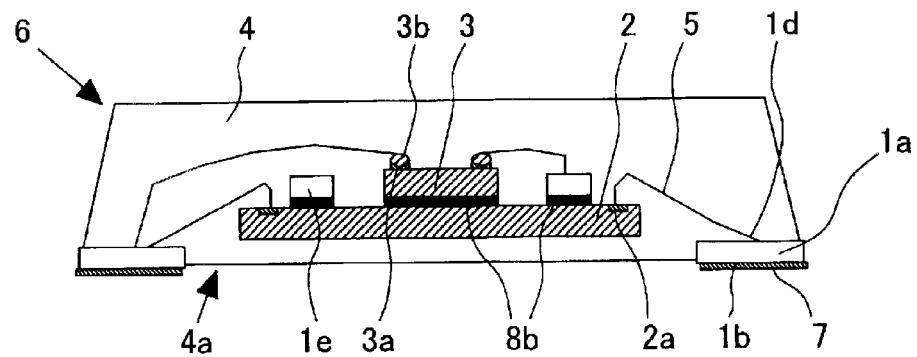
FIG. 27 is a cross-sectional view showing an example of a structure of a semiconductor device according to a third embodiment of the present invention.
Figure 28:
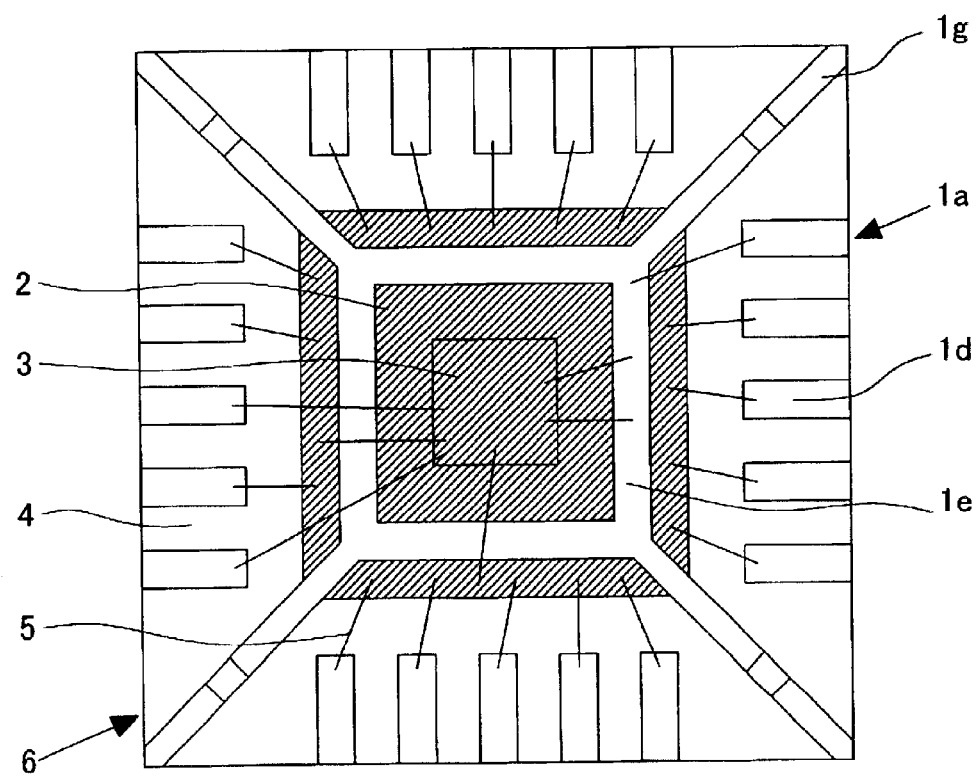
FIG. 28 is a plan view showing the structure of the semiconductor device according to the third embodiment shown in FIG. 27.

FIG. 27 is a cross-sectional view showing an example of a structure of a semiconductor device according to a third embodiment of the present invention, and FIG. 28 is a plan view showing the structure of the semiconductor device 6 shown in FIG. 27.

The semiconductor device shown in FIGS. 27 and 28 is a semiconductor package of a resin-sealed type and a surface-mounting type employing a lead frame. In the description of the third embodiment, the semiconductor device 6 is taken as an example of this semiconductor device.

As shown in FIG. 27, in the semiconductor device 6, a first surface of the first semiconductor chip 2, which is a circuit forming surface, is supported on one surface of a frame-shaped tab 1e (chip mounting portion) through, for example, silicone rubber or insulative sheet or the like. A second surface of the second semiconductor chip 3, which is opposite to a first surface thereof, is stacked and mounted on the first surface of the first semiconductor chip 2 through an insulative die bond material 8b such as silicone rubber or insulative sheet or the like. Also, a plurality of electrode pads 2a and 3a of each semiconductor chip and a plurality of leads 1a are connected through conductive wires 5 such as gold wires, etc., respectively.

At this time, the second semiconductor chip 3 is arranged in the opening of the frame-shaped tab 1e. Also, since the electrode pads of the first semiconductor chip 2 are located outside the frame-shaped tab 1e, the plurality of electrode pads 2a and 3a of each semiconductor chip can be easily connected to the plurality of leads 1a and the frame-shaped tab 1e through the conductive wires 5, respectively.

Bumps 3b made of gold, etc. are formed on the electrode pads 3a of the second semiconductor chip 3 in advance, for example, in the same manner as that used to form wire bumps. In the wire bonding, the side of each lead 1a or the first semiconductor chip 2 is first bonded by using gold balls (tips) formed on the wires 5 (hereinafter "first bonding"). Thereafter, the tails (end) of the wires 5 are bonded to the bumps 3b (hereinafter "second bonding"), whereby each angle of the wires 5 on the bumps 3b becomes almost horizontal. Therefore, it is possible to lower the height of the wires and to achieve the reduction of thickness of the semiconductor device 6 even if the semiconductor chips are stacked.

The side of the first semiconductor chip 2 is connected by the first bonding, and the side of each lead 1a is connected by the second bonding, and further the first semiconductor chip 2 and the tab suspension leads 1g are also wire-bonded. Accordingly, portions of the tab suspension leads 1g are exposed from the mounting surface, and the tab 1e is embedded in the resin sealing body 4.

Note that, in the third embodiment, since the first semiconductor chip 2 is arranged on one surface of the frame-shaped tab 1e and the second semiconductor chip 3 is arranged in the opening of the frame-shaped tab 1e, the height after mounting the respective semiconductor chips is not influenced from the thickness of the tab 1e, thereby facilitating the reduction in the thickness of the semiconductor device 6.

Next, the manufacturing method for the semiconductor device 6 according to the third embodiment will be described.

Although the manufacturing method of the third embodiment is, basically, similar to that in the second embodiment, both methods are, however, different in the following points.

The lead frame used here is basically similar to that used in the second embodiment shown in FIG. 17, but is different in that the inside of the tab 1e is hollowed out and formed into a frame shape as shown in FIG. 28.

(1) Further, in the die bonding step, to support the first semiconductor chip 2 on the one surface of the tab 1e as shown in FIG. 27, for example, silicone rubber, insulative sheet or the like 8b is adhered on the rear surface of the table in advance, and the first semiconductor chip 2 and the tab 1e are positioned and then adhered.

(2) Next, the second semiconductor chip 3 is supported on the first surface, which is the circuit forming surface of the first semiconductor chip 2, through an insulative die bonding material 8b such as insulative silicone rubber, insulative sheet or the like. Note that step (1) may be performed after step (2).

Subsequently, as shown in FIG. 27, through conductive wires 5 such as gold wires, etc., the plurality of electrode pads 2a of the first semiconductor chip 2 are connected to the plurality of leads 1a, the tab 1e, or some of the electrode pads 3a of the second semiconductor chip 3. Furthermore, the plurality of electrode pads 3a of the second semiconductor chip 3 are connected to the plurality of leads 1a or the tab 1e. In this case, bumps made of gold, etc. are formed on the electrode pads 3a of the second semiconductor chip 3 in advance, for example, in the same manner as that used to form wire bumps. The wire bonding is used as the first bonding on the side of each lead 1a or the first semiconductor chip 2, and as the second bonding on the bump side. The second bonding is performed to the bumps.

The subsequent manufacturing method and mounting method from the molding step to the cutting step are identical to those in the second embodiment.

Figure 29:
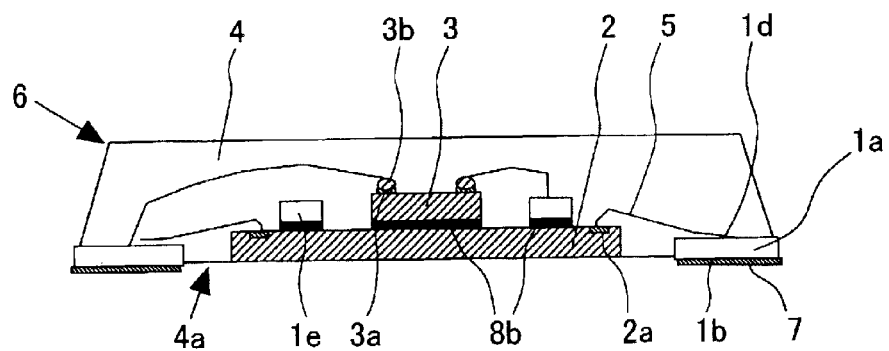
FIG. 29 is a cross-sectional view showing a modified example in the third embodiment.
Figure 30:
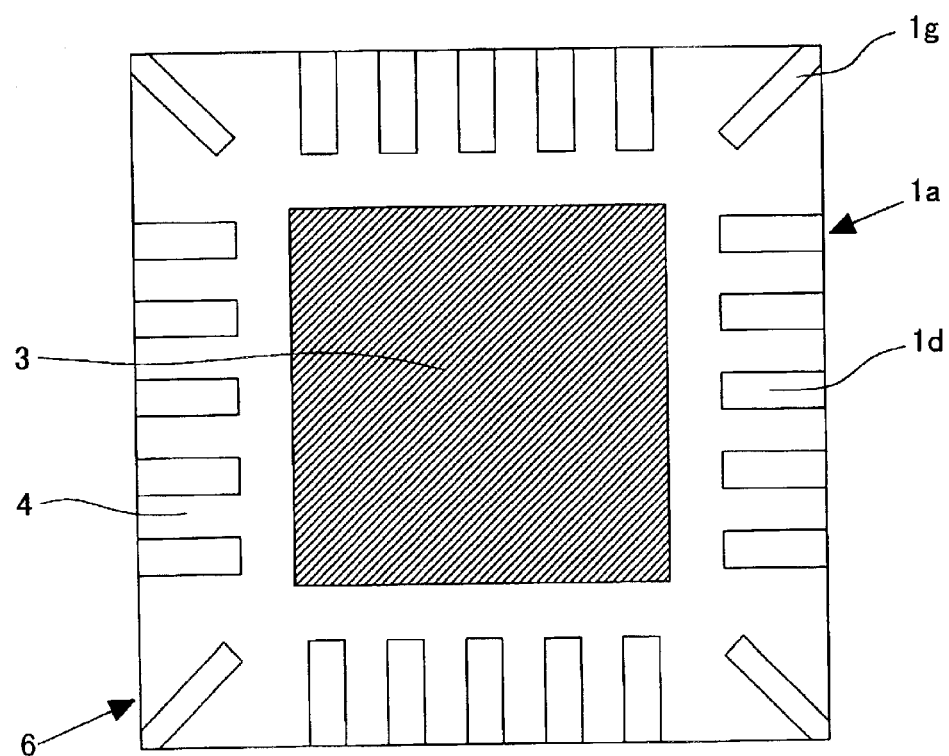
FIG. 30 is a bottom plan view (mounting surface) showing the structure of the semiconductor device shown in FIG. 29.

The semiconductor device shown in FIGS. 29 and 30 is a modified example of the semiconductor device in the third embodiment, in which the second surface of the first semiconductor chip 2 is exposed on the mounting surface 4a of the semiconductor device 6. FIG. 29 is a cross-sectional view showing a modified example in the third embodiment. The plan view of FIG. 29 is equivalent to FIG. 28, and FIG. 30 is a bottom plan view (mounting surface) showing the structure of the semiconductor device shown in FIG. 29.

When the structure of this modified example is employed, it is possible to achieve the largest thickness reduction of the semiconductor device in comparison with other embodiments.

(Fourth Embodiment)

Figure 31:
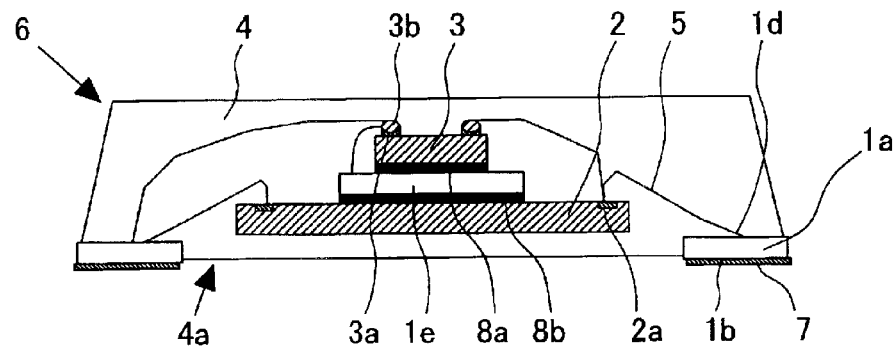
FIG. 31 is a cross-sectional view showing an example of a structure of a semiconductor device according to a fourth embodiment of the present invention.
Figure 32:
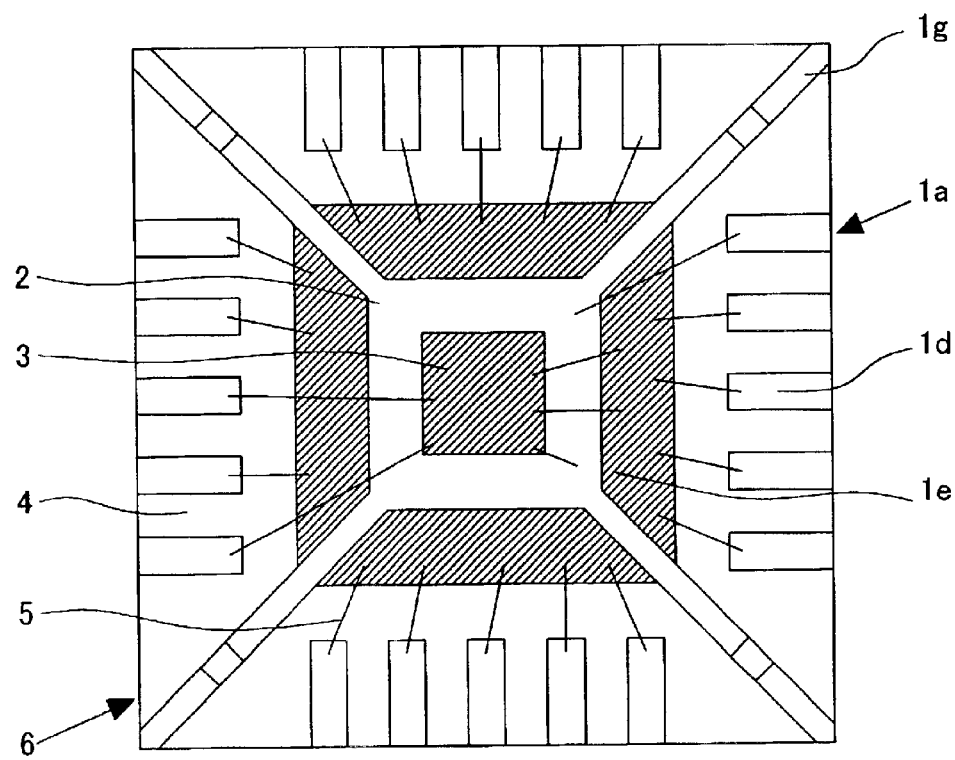
FIG. 32 is a plan view showing the structure of the semiconductor device according to the fourth embodiment shown in FIG. 31.

FIG. 31 is a cross-sectional view showing an example of a structure of a semiconductor device according to a fourth embodiment of the present invention, and FIG. 32 is a plan view showing the structure of the semiconductor device 6 shown in FIG. 31.

Figure 33:
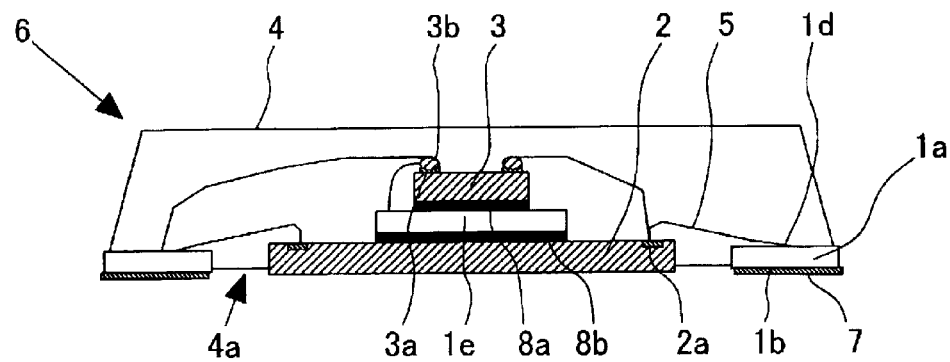
FIG. 33 is a cross-sectional view showing a modified example in the fourth embodiment shown in FIG. 31.

The semiconductor device shown in FIGS. 31 to 33 is a semiconductor package of a resin-sealed type and a surface-mounting type employing a lead frame.

In the description of a fourth embodiment, the semiconductor device 6 is taken as an example of this semiconductor device.

As shown in FIG. 31, in the semiconductor device 6, a first semiconductor chip 2 is supported on one surface of a tab 1e through insulative silicone rubber, insulative sheet or the like 8b, and a second semiconductor chip 3 is stacked and mounted on the other surface of the tab 1e through a conductive die bonding material 8a such as silver paste or adhering film. Also, a plurality of electrode pads 2a and 3a of each semiconductor chip and a plurality of leads 1a are connected through conductive wires 5 such as gold wires, etc., respectively.

At this time, since the second semiconductor chip 3 is located inside the plan view area covered by the tab 1e and the electrode pads in the periphery of the first semiconductor chip 2 are located outside the plan view area of the tab 1e, the plurality of electrodes of each semiconductor chip can be easily connected to the plurality of leads 1a and the tab 1e through the conductive wires 5.

The plurality of electrode pads 3a of the second semiconductor chip 3 are connected to the plurality of leads 1a or the tab 1e. In this case, bumps 3b made of gold or the like are formed on the electrode pads 3a of the second semiconductor chip 3 in advance, for example, in the same manner as that used to form wire bumps. In the wire bonding, the side of each lead 1a or the first semiconductor chip 2 is first bonded by using gold balls (tips) formed on the wires 5

(hereinafter "first bonding"). Thereafter, the tails (end) of the wires 5 are bonded to the bumps 3b (hereinafter "second bonding"), whereby each angle of the wires 5 on the bumps 3b becomes almost horizontal. Therefore, it is possible to lower the height of the wires and to achieve the reduction in thickness of the semiconductor device 6 even if the semiconductor chips are stacked.

The sides of the electrode pads 2a are connected by the first bonding, and those of the leads 1a are connected by the second bonding, and further the first semiconductor chip 2 and the tab suspension leads 1g are also wire-bonded. Accordingly, portions of the tab suspension leads 1g are exposed from the mounting surface and the first semiconductor chip 2 is embedded in the resin sealing body 4.

Next, the manufacturing method for the semiconductor device 6 according to the fourth embodiment will be described.

Although the manufacturing method of the fourth embodiment is, basically, similar to that of the second embodiment, both methods are, however, different in the following points.

(1) In the die bonding step, to support the first semiconductor chip 2 on the one surface of the tab 1e as shown in FIG. 31, for example, silicone rubber, insulative thermosetting adhering sheet or the like is adhered on the one surface of the tab 1e in advance, and the first semiconductor chip 2 and the tab 1e are positioned and then adhered.

(2) Next, the second semiconductor chip 3 is supported on the other surface of the tab 1e through the insulative die bonding material 8a such as silver paste or adhering film. Note that step (1) may be performed after step (2).

Subsequently, as shown in FIG. 31, the plurality of electrode pads 2a of the first semiconductor chip 2 are connected to the plurality of lead frames 1d, the tab 1e, or some of the electrode pads 3a of the second semiconductor chip 3 through the conductive wires 5 such as gold wires, etc. Furthermore, the plurality of electrode pads 3a of the second semiconductor chip 3 are connected to the plurality of leads 1a or the tab 1e. In this case, bumps 3b made of gold, etc. are formed on the electrode pads 3a of the second semiconductor chip 3 in advance, for example, in the same manner as that used to form wire bumps. The wire bonding is used as the first bonding on the side of each lead 1a or the first semiconductor chip 2, and as the second bonding on the bump side. The second bonding is performed to the bumps.

The subsequent manufacturing method and mounting method from the molding step to the cutting step are identical to those in the second embodiment.

The semiconductor device shown in FIG. 33 is a modified example of the semiconductor device in the fourth embodiment, in which the second surface of the first semiconductor chip 2 is exposed on the mounting surface 4a of the semiconductor device 6. FIG. 33 is a cross-sectional view showing a modified example in the fourth embodiment. The plan view of FIG. 33 is equivalent to FIG. 32, and the bottom plan view (mounting surface) showing the structure of the semiconductor device in FIG. 33 is the same as FIG. 30.

Figure 34:
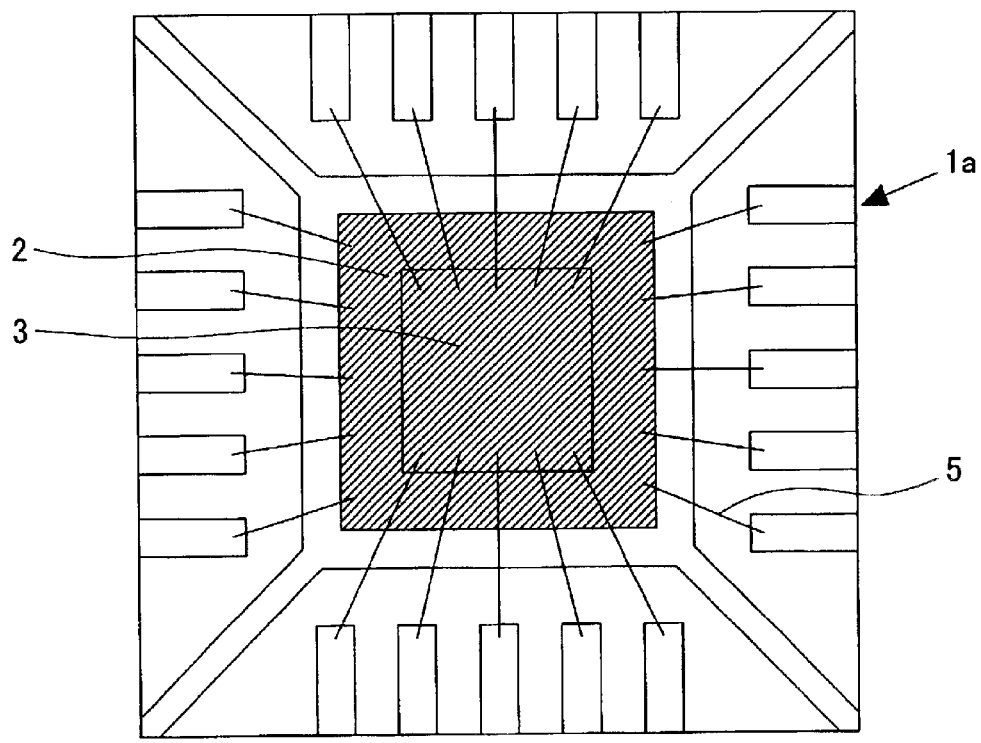
FIG. 34 is a plan view of a semiconductor device showing the case where a microcomputer is stacked on a first semiconductor chip 2 and an SRAM is stacked on the second semiconductor chip 3 in the semiconductor device.
Figure 35:
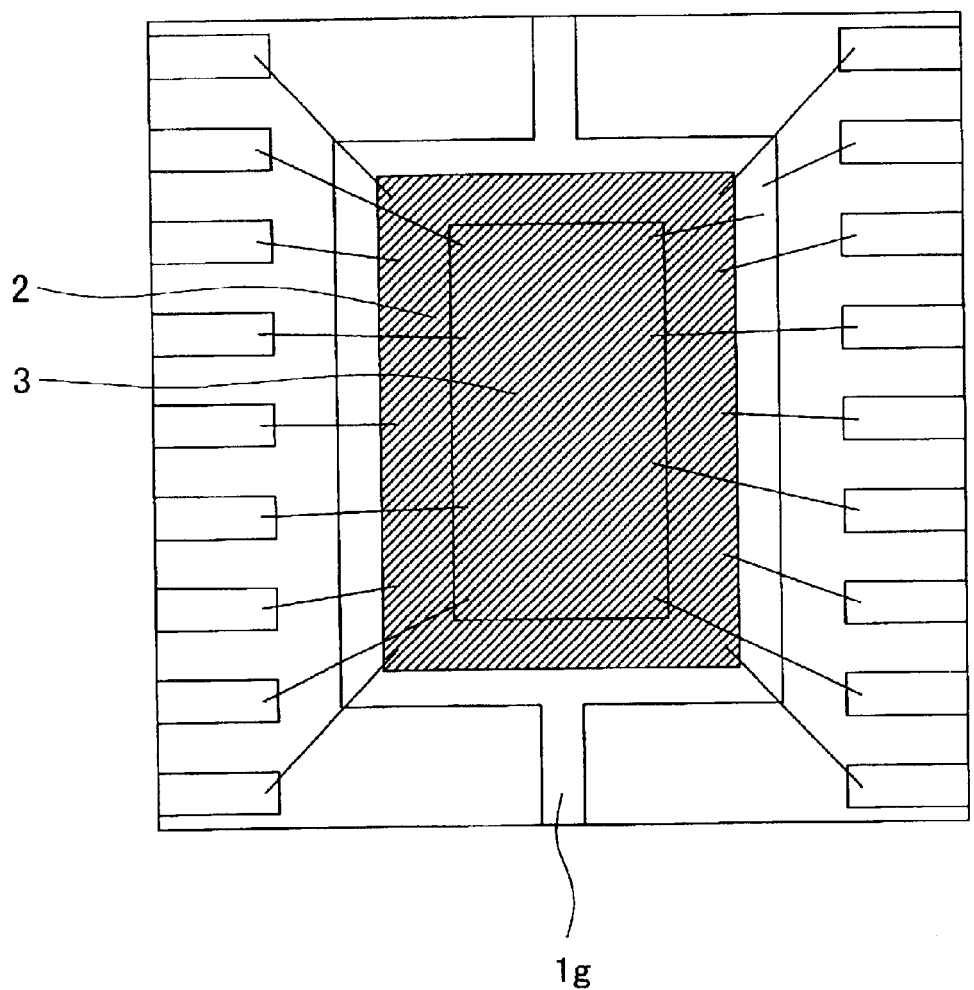
FIG. 35 shows an example of the semiconductor device in which external connection terminals are arranged on two sides, and is a plan view of a semiconductor device showing the case where a flash microcomputer is stacked on the first semiconductor chip 2 and a DRAM is stacked on the second semiconductor chip 3.
Figure 36:
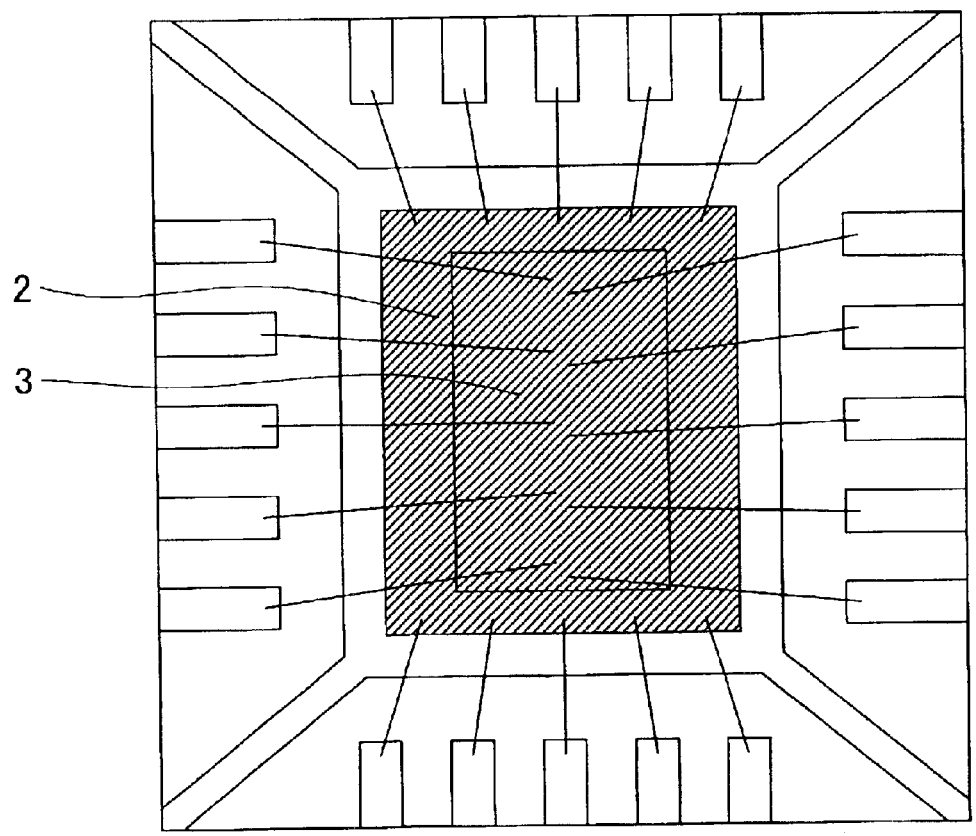
FIG. 36 is a plan view of a semiconductor device showing the case where a flash microcomputer is stacked on the first semiconductor chip 2 and a DRAM is stacked on the second semiconductor chip 3 in the semiconductor device.
Figure 37:
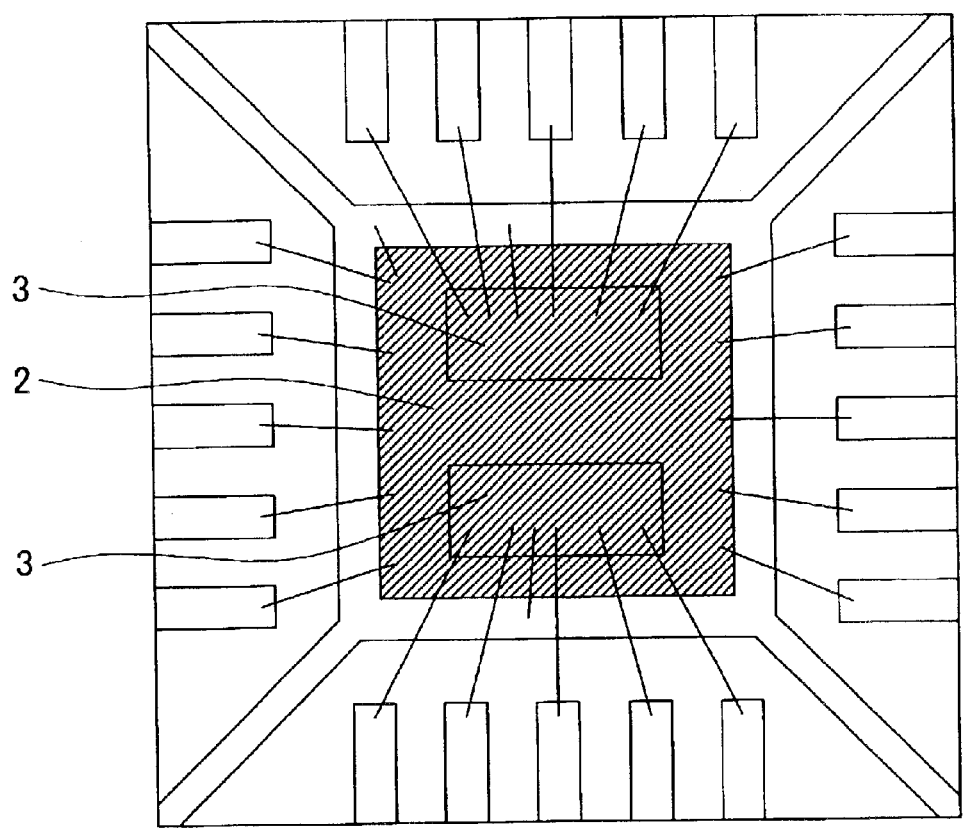
FIG. 37 is plan view of a semiconductor device showing the case where a microcomputer is stacked on the first semiconductor chip 2 and two SRAMs are respectively stacked on the second and third semiconductor chips in the semiconductor device.

Next, the modified example of wire bonding layout in the fourth embodiment of the present invention is shown in FIGS. 34 to 37. FIG. 34 is a plan view of a semiconductor device showing the case where a microcomputer is stacked on the first semiconductor chip 2 and an SRAM is stacked on the second semiconductor chip 3 in the semiconductor device; FIG. 35 shows an example of the semiconductor device in which external connection terminals are arranged on two sides and is a plan view of the semiconductor device showing the case where a flash microcomputer is stacked on the first semiconductor chip 2 and a DRAM is stacked on the second semiconductor chip 3; FIG. 36 is a plan view of the semiconductor device showing the case where a flash microcomputer is stacked on the first semiconductor chip 2 and a DRAM is stacked on the second semiconductor chip 3 in the semiconductor device; and FIG. 37 is plan view of the semiconductor device showing the case where a microcomputer is stacked on the first semiconductor chip 2 and two SRAMs are stacked on the second and third semiconductor chips in the semiconductor device.

Figure 38:
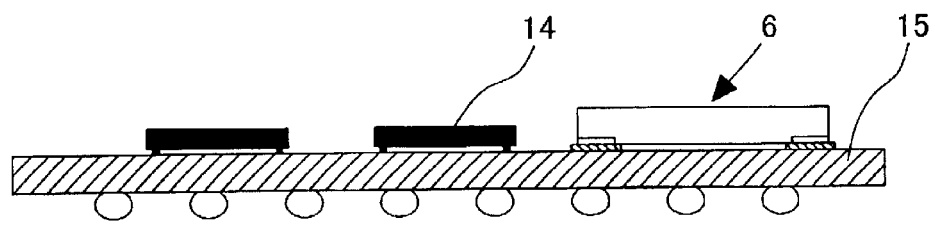
FIG. 38 is a cross-sectional view showing the state where the semiconductor device is mounted on a multi chip module.
Figure 39:
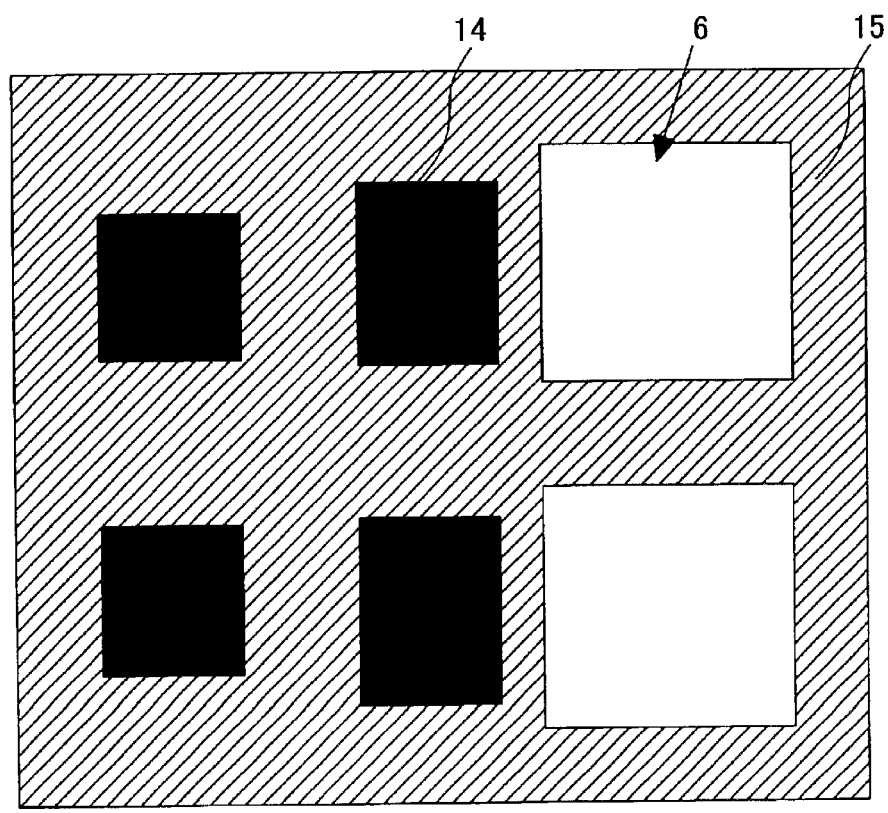
FIG. 39 is a plan view showing the state where the semiconductor device is mounted on the multi chip module.
Figure 40:
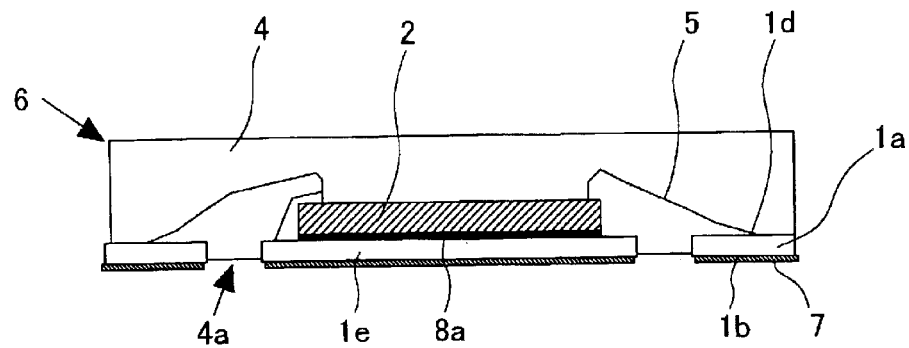
FIG. 40 is a cross-sectional view showing an example of a structure of a conventional semiconductor device.
Figure 41:
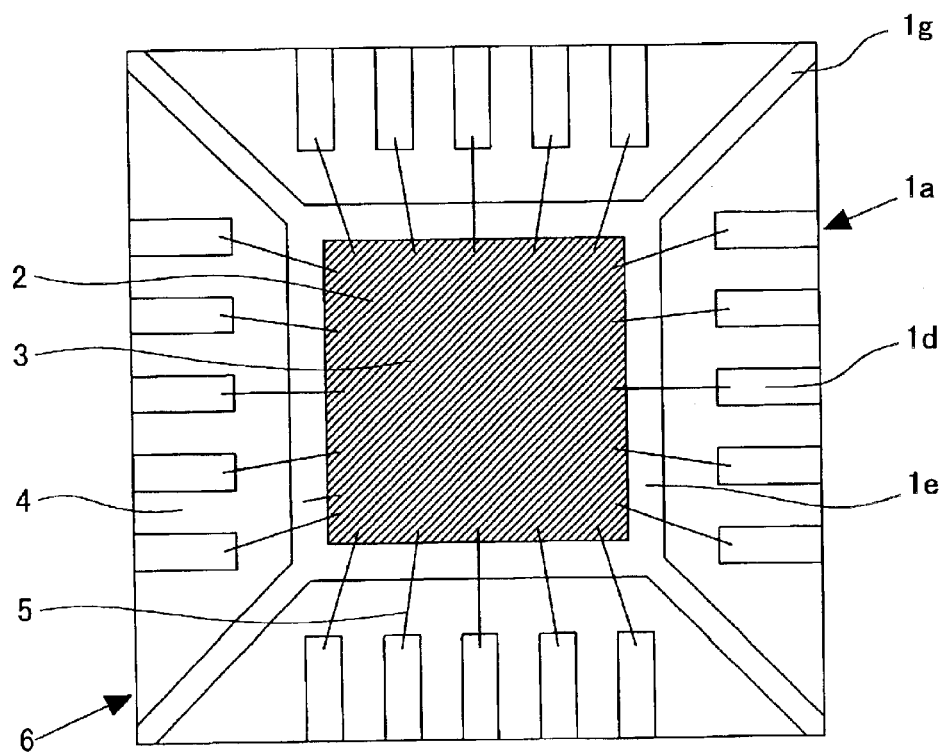
FIG. 41 is a plan view showing the structure of the semiconductor device shown in FIG. 40.

FIGS. 38 and 39 show the state where the semiconductor device 6 of the above-mentioned embodiment of the present invention is mounted on the multi-chip module; FIG. 38 is a cross-sectional view showing an example of its structure; and FIG. 39 is a plan view showing an example of its structure. The multi-chip module is mounted on the board 15 together with one or more flip chips 14, thereby allowing for achieving the reductions in the size of the mounting area on the board and in the mounting height.

In the foregoing, the present invention has been concretely described based on the embodiments, but, needless to say, is not limited to the above-mentioned embodiments and can be variously modified and changed without departing from the gist thereof.

For example, in the above-described embodiments of the present invention, the example in which the present invention is applied to the manufacture of the semiconductor device of which external connection terminals are arranged on the four sides has been mainly described. However, the present invention may be applied to, for example, the manufacture of a semiconductor device of which external connection terminals thereof are arranged on the two sides, thereby allowing for obtaining the same advantages.

By adopting a non-lead type package employing a lead frame in a multi-chip type package semiconductor device, in which chips are stacked in and mounted on one package, it is possible to reduce the mounting height, the size of the mounting area, and the weight thereof. Additionally, it is also possible to realize the semiconductor device at low cost since the existing apparatus is used. Also, since there are only a few restrictions for the chip size and for the arrangement of the electrode pads in stacking the LSI chips, the existing LSI chips can be used in combination. In addition, the tab or the electrode pads of the LSI chips can be used as connector terminals in the electrical connection between two LSI chips that are stacked, thereby allowing for improving the versatility at the time of the extension of the leads.

What is claimed is:

1. A semiconductor device comprising:
    a sealing body made of an insulative resin;
    a tab on which a semiconductor chip is mounted;
    a plurality of leads each having one surface exposed on a mounting surface of said sealing body;
    a first semiconductor chip located in said sealing body and having a first surface to be a circuit forming surface and a second surface opposite to the first surface, the second surface being supported on one surface of said tab through adhesive;
    a plurality of electrode pads formed in the periphery of the first surface of said first semiconductor chip;
    conductive wires for electrically connecting said electrode pads and said leads;
    a second semiconductor chip having a first surface to be a circuit forming surface and a second surface opposite to the first surface, and stacked and mounted on the first surface of the first semiconductor chip toward the second surface thereof;

a plurality of electrode pads formed on the first surface of said second semiconductor chip; and conductive wires for electrically connecting the electrode pads of said second semiconductor chip and said leads.

2. The semiconductor device according to claim 1, wherein said second semiconductor chip is arranged at a position inside the electrodes of said first semiconductor chip.

3. The semiconductor device according to claim 1, wherein bumps are formed on the electrode pads of said second semiconductor chip, one end of each of said wires is connected to each of said leads or the electrode pads of said first semiconductor chip, and the other end thereof is connected through each of said bumps.

4. The semiconductor device according to claim 1, wherein at least one of the plurality of electrode pads of said first semiconductor chip are electrically connected to said tab by said wires.

5. The semiconductor device according to claim 1, wherein one surface of said tab is exposed on the mounting surface of said sealing body.

6. The semiconductor device according to claim 1, wherein said tab is arranged at a position inside the periphery of said first semiconductor chip, and the second surface of said first semiconductor chip is closely adhered to said insulative resin at the position outside the periphery of said tab.

7. A semiconductor device comprising:

a sealing body made of an insulative resin;

a tab for supporting a semiconductor chip;

a plurality of leads each having one surface exposed on a mounting surface of said sealing body;

a first semiconductor chip located in said sealing body, having a first surface to be a circuit forming surface and a second surface opposite to the first surface, and supported on one surface of said tab through adhesive;

a plurality of electrode pads formed in the periphery of the first surface of said first semiconductor chip;

conductive wires for electrically connecting said electrode pads and said leads;

a second semiconductor chip having a first surface to be a circuit forming surface and a second surface opposite to the first surface, and stacked and mounted on the first surface of the first semiconductor chip; and conductive wires for electrically connecting a plurality of electrode pads formed on the first surface of said second semiconductor chip and said leads, wherein said tab is formed into a frame shape; the first semiconductor chip is adhered to one surface of the frame-shaped tab at a position inside the electrode pads on the first surface thereof; said second semiconductor chip is located on the first surface of said first semiconductor chip and at a position inside an opening of said frame-shaped tab; and said frame-shaped tab and said second semiconductor chip are adhered on the same surface.

8. The semiconductor device according to claim 7, wherein said first semiconductor chip and said second semiconductor chip are connected to each other by connecting at least two of the electrode pads formed on each first surface through said conductive wires, or connected to said frame-shaped tab through said conductive wires.

9. The semiconductor device according to claim 7, wherein the second surface of said first semiconductor chip is exposed to the mounting surface of said sealing body.

10. The semiconductor device according to claim 7, wherein the second surface of said first semiconductor chip is sealed in said insulative resin.

11. A semiconductor device comprising:

a sealing body made of an insulative resin;

a tab for supporting a semiconductor chip;

a plurality of leads each having one surface exposed on a mounting surface of said sealing body;

a first semiconductor chip located in said sealing body, having a first surface to be a circuit forming surface and a second surface opposite to the first surface, and supported on one surface of said tab through adhesive;

a plurality of electrode pads formed in the periphery of the first surface of said first semiconductor chip; and conductive wires to electrically connect said electrode pads and said leads, wherein the device includes a second semiconductor chip having a first surface to be a circuit forming surface and a second surface opposite to the first surface; the second surface of said second semiconductor chip is adhered to one surface of said tab; said electrode pads and said leads and a plurality of electrode pads formed on the first surface of said second semiconductor chip are electrically connected through the conductive wires; the first surface of said first semiconductor chip is adhered to the other surface of said tab; and said tab and said second semiconductor chip are each located at a position inside the electrode pads on the first surface of the first semiconductor chip.

12. The semiconductor device according to claim 11, wherein said first semiconductor chip and said second semiconductor chip are connected to each other by connecting at least two of the electrode pads formed on each first surface through said conductive wires, or connected to said tab through said conductive wires.

13. The semiconductor device according to claim 11, wherein the second surface of said first semiconductor chip is exposed to the mounting surface of said sealing body.

14. The semiconductor device according to claim 11, wherein the second surface of said first semiconductor chip is sealed in said insulative resin.

* * * * *